United States Patent
Lim et al.

(10) Patent No.: US 11,791,287 B2
(45) Date of Patent: *Oct. 17, 2023

(54) SEMICONDUCTOR DEVICE INCLUDING A CUTTING REGION HAVING A HEIGHT GREATER THAN A HEIGHT OF A CHANNEL STRUCTURE

(71) Applicant: Samsung Electronics Co., Ltd., Suwon-si (KR)

(72) Inventors: Geun Won Lim, Yongin-si (KR); Seok Cheon Baek, Hwaseong-si (KR); Ji Sung Cheon, Ansan-si (KR); Jong Woo Shin, Seoul (KR); Bong Hyun Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 51 days.

This patent is subject to a terminal disclaimer.

(21) Appl. No.: 17/462,522

(22) Filed: Aug. 31, 2021

(65) Prior Publication Data

US 2021/0398915 A1 Dec. 23, 2021

Related U.S. Application Data

(63) Continuation of application No. 16/227,919, filed on Dec. 20, 2018, now Pat. No. 11,133,267.

(30) Foreign Application Priority Data

Apr. 25, 2018 (KR) .................... 10-2018-0047766

(51) Int. Cl.
*H01L 23/00* (2006.01)
*H10B 43/27* (2023.01)
*H10B 43/40* (2023.01)

(52) U.S. Cl.
CPC .......... *H01L 23/562* (2013.01); *H10B 43/27* (2023.02); *H10B 43/40* (2023.02)

(58) Field of Classification Search
CPC ......... H01L 27/11573; H01L 27/11582; H01L 27/11575; H01L 27/0611; H01L 21/76;
(Continued)

(56) References Cited

U.S. PATENT DOCUMENTS 8,952,443 B2 2/2015 Chang et al.
9,111,592 B2 8/2015 Maejima
(Continued)

FOREIGN PATENT DOCUMENTS

KR 1020150142366 A 12/2015
KR 1020170128996 A 11/2017
KR 20190091109 A 8/2019

*Primary Examiner* — Khiem D Nguyen
(74) *Attorney, Agent, or Firm* — Myers Bigel, P.A.

(57) ABSTRACT

A semiconductor device includes a peripheral circuit region on a lower substrate, and including circuit elements, memory cell regions including memory cells on each of a first upper substrate and a second upper substrate, which are on the lower substrate, at least one cutting region between the first upper substrate and the second upper substrate, and at least one semiconductor pattern between the first upper substrate and the second upper substrate, and adjacent to the at least one cutting region.

20 Claims, 26 Drawing Sheets

(58) Field of Classification Search
CPC ............. H01L 21/78; H01L 21/823475; H01L 25/0657; H01L 23/562; H10B 43/27; H10B 43/40; H10B 43/50
USPC ........................................................ 257/324
See application file for complete search history.

(56) References Cited

U.S. PATENT DOCUMENTS

| | | |
|---|---|---|
| 9,368,508 B2 | 6/2016 | Jee et al. |
| 9,595,346 B2 | 3/2017 | Lee et al. |
| 9,666,289 B2 | 5/2017 | Lee et al. |
| 9,691,782 B1 | 6/2017 | Hwang et al. |
| 9,831,260 B2 * | 11/2017 | Zhang ............... H01L 27/11582 |
| 11,133,267 B2 * | 9/2021 | Lim .................. H01L 27/11582 |
| 2004/0238867 A1 | 12/2004 | Park |
| 2012/0088332 A1 * | 4/2012 | Lee ........................ H01L 25/50 |
| | | 257/E21.499 |
| 2015/0129878 A1 | 5/2015 | Shin et al. |
| 2015/0263011 A1 * | 9/2015 | Hong ............... H01L 27/11582 |
| | | 438/269 |
| 2015/0325588 A1 | 11/2015 | Lee et al. |
| 2015/0364487 A1 | 12/2015 | Yun |
| 2016/0163732 A1 | 6/2016 | Lim et al. |
| 2017/0025545 A1 * | 1/2017 | Nam .................. H01L 29/78642 |
| 2017/0133398 A1 | 5/2017 | Son et al. |
| 2017/0323900 A1 * | 11/2017 | Kanamori ........... H01L 27/0688 |
| 2017/0330887 A1 * | 11/2017 | Kim .................... H01L 27/1157 |
| 2018/0040553 A1 | 2/2018 | Tak et al. |
| 2019/0237477 A1 | 8/2019 | Baek et al. |

\* cited by examiner

SEMICONDUCTOR DEVICE INCLUDING A CUTTING REGION HAVING A HEIGHT GREATER THAN A HEIGHT OF A CHANNEL STRUCTURE

CROSS-REFERENCE TO RELATED APPLICATION(S)

This application is a continuation of U.S. application Ser. No. 16/227,919, filed Dec. 20, 2018, issued as U.S. Pat. No. 11,133,267, which claims priority to Korean Patent Application No. 10-2018-0047766 filed on Apr. 25, 2018, in the Korean Intellectual Property Office, the disclosure of which is hereby incorporated by reference herein in its entirety.

BACKGROUND

1. Field

The present inventive concept relates to a semiconductor device and a method for manufacturing the same.

2. Description of Related Art

As demand for high performance, high speed, and/or versatility in electronic devices increases, the degree of integration of semiconductor devices in electronic devices is also increasing. According to the trend for higher degrees of integration of semiconductor devices, patterns for forming semiconductor devices are becoming smaller. Therefore, it may be important to reduce or prevent defects in a manufacturing process.

SUMMARY

An aspect of the present inventive concept is to provide a semiconductor device with improved reliability and a method for manufacturing the same.

According to an aspect of the present inventive concept, a semiconductor device comprises: a peripheral circuit region on a lower substrate, and comprising circuit elements; memory cell regions comprising memory cells on each of a first upper substrate and a second upper substrate, which are on the lower substrate; at least one cutting region between the first upper substrate and the second upper substrate; and at least one semiconductor pattern between the first upper substrate and the second upper substrate, and adjacent to the at least one cutting region.

According to an aspect of the present inventive concept, a semiconductor device comprises: a lower substrate; circuit elements on the lower substrate; a lower interlayer insulating layer at least partially covering the circuit elements; a plurality of upper substrates on the lower substrate; a plurality of gate electrodes on the plurality of upper substrates, respectively; an upper interlayer insulating layer at least partially covering the plurality of gate electrodes; and at least one cutting region between the plurality of upper substrates, and passing through the upper interlayer insulating layer and in contact with the lower interlayer insulating layer.

According to an aspect of the present inventive concept, a method for manufacturing a semiconductor device comprises: forming circuit elements comprising a peripheral circuit on a lower substrate; forming upper substrates and semiconductor patterns connecting the upper substrates to each other; alternately stacking sacrificial layers and mold insulating layers on the upper substrates; forming channel structures passing through the sacrificial layers and the mold insulating layers; forming at least one cutting region between the semiconductor patterns; and removing the sacrificial layers and forming gate electrodes in a region from which the sacrificial layers are removed.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, example embodiments of the present disclosure will be described in detail with reference to the accompanying drawings. As used herein, the term "and/or" includes any and all combinations of one or more of the associated listed items.

Some embodiments of the inventive concept stein from a realization that in a Cell on Peripheral (COP) of a VNAND device, during an etching process for formation of a channel hole, positive ions may accumulate on an upper substrate below the channel hole and electrons may accumulate in the Amorphous Carbon Layer (ACL) mask. As a result, a potential difference may be generated, which result in arcing. To prevent or reduce the likelihood of the arcing occurring, bridge patterns may be formed to connect upper substrates to each other and go ground an upper substrate to a lower substrate. Then, the channel holes are etched. After the etching of the channel holes is completed, the bridge patterns may be cut using cutting areas defined therefor. Thus, the bridge patterns may serve as a current path to discharge any potential difference that may be generated during the etching process, thereby reducing the risk of unwanted arcing.

Figure 1:
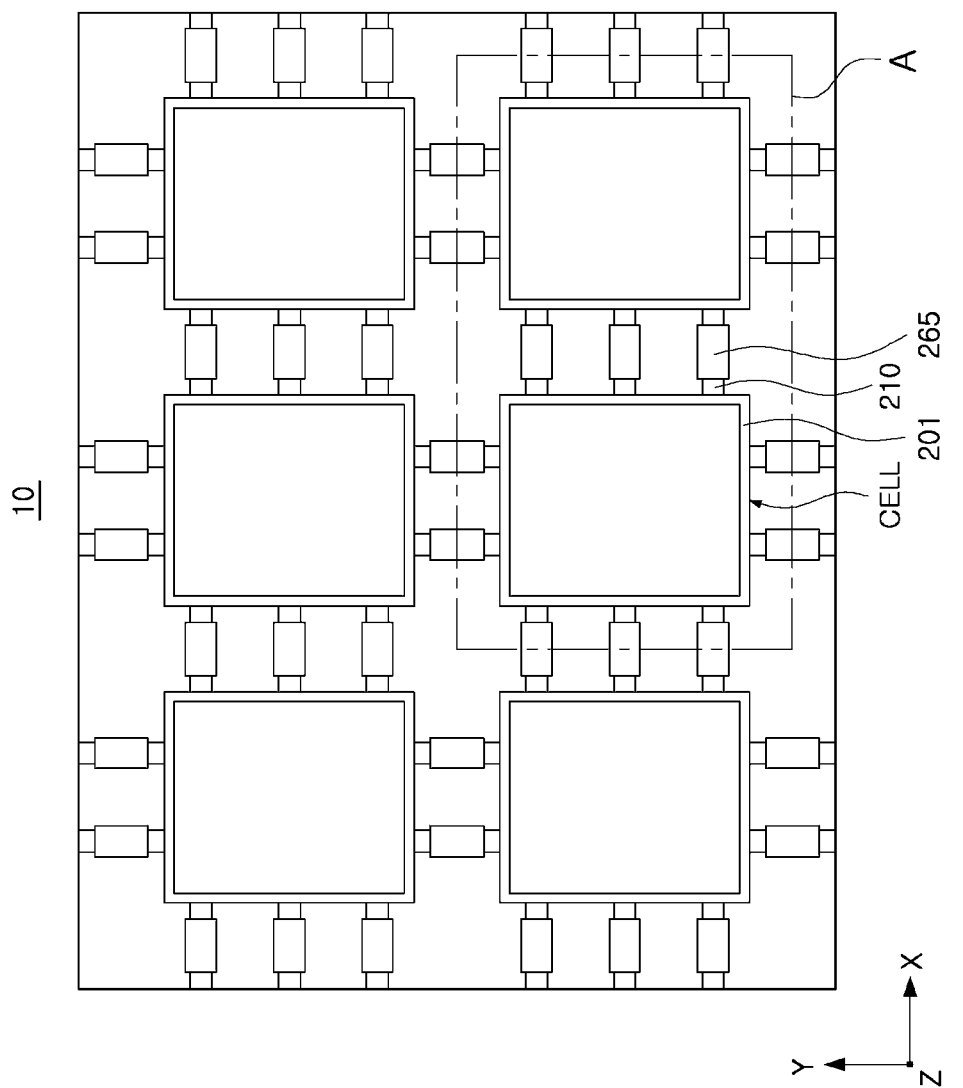
FIG. 1 is a schematic plan view of a semiconductor device according to an example embodiment of the inventive concept.
Figure 2:
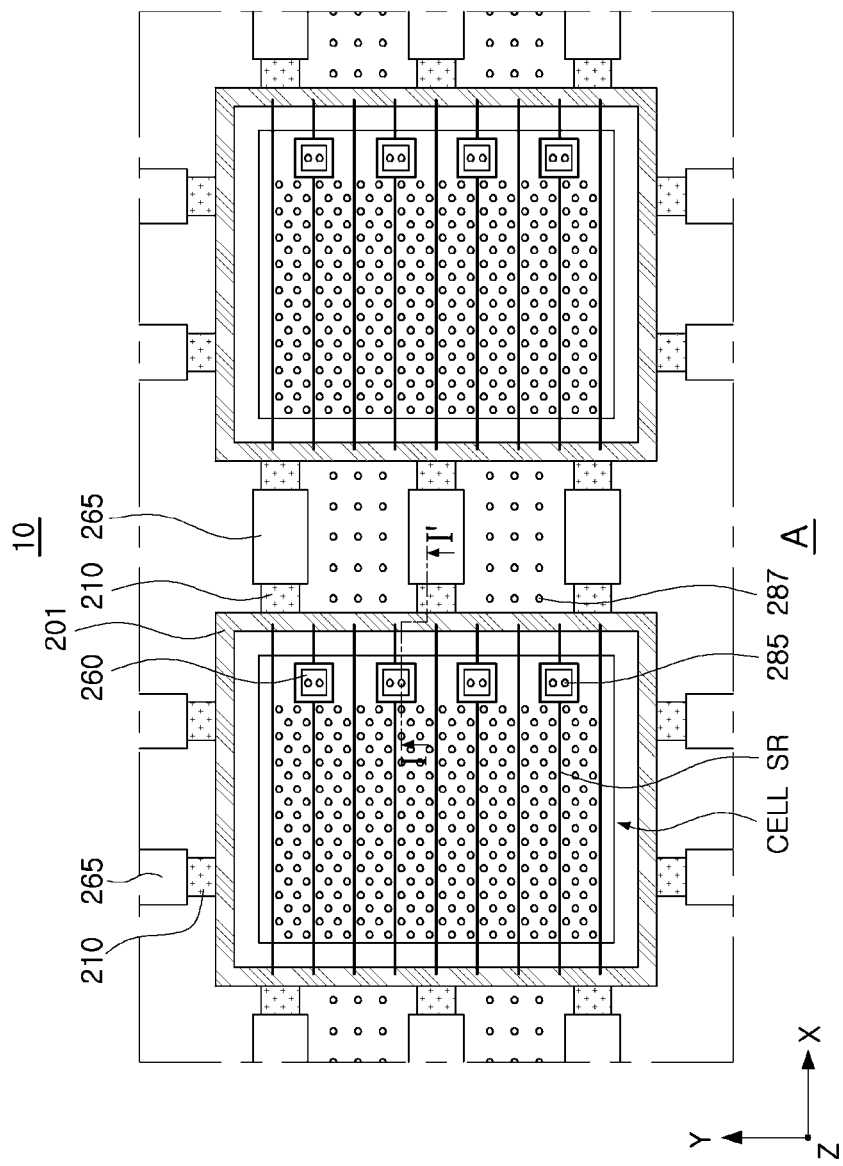
FIG. 2 is an enlarged view of region 'A' of FIG. 1.
Figure 3:
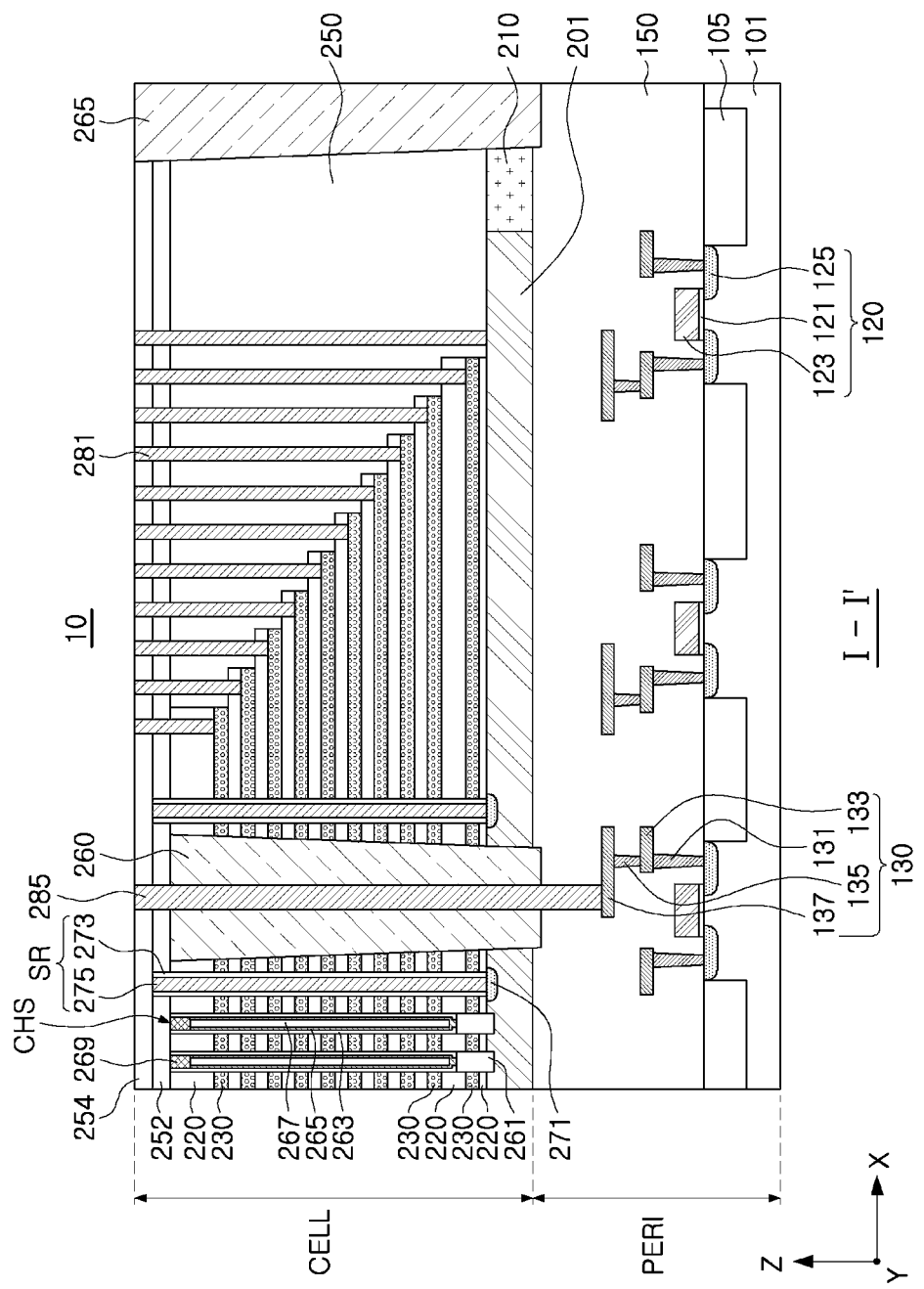
FIG. 3 is a schematic cross-sectional view of a semiconductor device according to an example embodiment of the inventive concept, and a cross-sectional view taken along line I-I' of FIG. 2.

FIG. 1 is a schematic cross-sectional view of a semiconductor device according to an example embodiment of the inventive concept. FIG. 2 is an enlarged view of region 'A' of FIG. 1. FIG. 3 is a schematic cross-sectional view of a semiconductor device according to an example embodiment of the inventive concept, and a cross-sectional view taken along line I-I' of FIG. 2.

Referring to FIGS. 1 to 3, a semiconductor device 10 may include a lower substrate 101 and upper substrates 201 disposed on the lower substrate 101. A peripheral circuit region PERI, which may be considered a first region, is provided on the lower substrate 101, and memory cell regions CELL, which may be considered a second region, may be provided on the upper substrates 201. The semiconductor device 10 may include cutting regions 265 spaced apart from each other on a periphery of the upper substrates 201. The cutting regions 265 may be disposed between the upper substrates 201. As illustrated, two or three cutting regions 265 are arranged between the upper substrates 201, but example embodiments are not limited thereto. The semiconductor device 10 may include semiconductor patterns 210 disposed between the upper substrates 201 and the cutting regions 265 and protruding from the upper substrates 201 in a horizontal direction (e.g., X-direction and/or Y-direction). The semiconductor patterns 210 may be in contact with the cutting regions 265, respectively. The semiconductor patterns 210 may be bridge patterns.

The peripheral circuit region PERI may include a lower substrate 101, circuit elements 120 disposed on the lower substrate 101, a lower interlayer insulating layer 150 covering the circuit elements 120, and a lower wiring structure 130.

The lower substrate 101 may have an upper surface extended in an X-direction and a Y-direction. The lower substrate 101 may include a semiconductor material, such as a Group IV semiconductor, a Group III-V compound semiconductor, and/or a Group II-VI compound semiconductor. For example, the Group IV semiconductor may include silicon, germanium, and/or silicon-germanium. The lower substrate 101 may be provided as a bulk wafer or an epitaxial layer. The lower substrate 101 may include well regions including an impurity and element isolation regions 105.

The circuit elements 120 may include a circuit gate dielectric layer 121, a circuit gate electrode layer 123, and a source/drain region 125. The circuit gate dielectric layer 121 may include silicon oxide, while the circuit gate electrode layer 123 may include a conductive material, such as a metal, polycrystalline silicon, and/or metal silicide. The source/drain region 125 may be doped with an impurity. In some embodiments, a spacer may be disposed on each of the sidewalls of the circuit gate electrode layer 123. For example, the spacer may be formed of silicon nitride.

The lower interlayer insulating layer 150 may cover or overlap at least a portion of the lower substrate 101 and the circuit elements 120 on the lower substrate 101, and may be disposed between the lower substrate 101 and the upper substrate 201. The lower interlayer insulating layer 150 may be formed of an insulating material.

The lower wiring structure 130 may include a first lower contact plug 131, a first lower wiring line 133, a second lower contact plug 135, and a second lower wiring line 137, sequentially stacked from the source/drain region 125 of the lower substrate 101. The number of wiring lines, forming the lower wiring structure 130, may be varied in various example embodiments. The lower wiring structure 130 may include a metal, for example, one or more of tungsten (W), copper (Cu), aluminum (Al), or the like.

The memory cell region CELL may include upper substrates 201, gate electrodes 230 spaced apart from each other and stacked perpendicularly to an upper surface of the upper substrates 201, mold insulating layers 220 alternately stacked with the gate electrodes 230, channel structures CHS disposed to pass through the gate electrodes 230, first to third upper interlayer insulating layers 250, 252, and 254, at least partially covering the gate electrodes 230 and gate contact plugs 281. A ground select transistor, memory cells, and a string select transistor are vertically arranged along each of the channel structures CHS, thereby forming a single memory cell string.

The upper substrates 201 may each have an upper surface extended in an X-direction and a Y-direction. The upper substrates 201 may each be disposed to have a size smaller than that of the lower substrate 101. The upper substrates 201 may include a semiconductor material, such as a Group IV semiconductor. For example, the upper substrates 201 may be provided as a polycrystalline silicon layer, but example embodiments are not limited thereto. For example, the upper substrates 201 may be provided as an epitaxial layer. The upper substrates 201 may include at least one well region including an impurity. For example, the entirety of an upper substrate 201 may form a single p-well region.

The gate electrodes 230 are spaced apart from each other and stacked perpendicularly to the upper substrates 201, and may be extended to different lengths in at least one direction, for example, in an X-direction. Each of the gate electrodes 230 may form a ground selection line of ground selection transistors of the semiconductor device 10, a word line of memory cells, and a string selection line of string selection transistors. The number of the gate electrodes 230 may be variously changed based on the data storage capacity of the semiconductor device 10. The gate electrodes 230 may include a metal material, such as tungsten (W). According to an example embodiment, the gate electrodes 230 may include polycrystalline silicon and/or a metal silicide material. In example embodiments, the gate electrodes 230 may further include a diffusion barrier. For example, the diffusion barrier may include tungsten nitride (WN), tantalum nitride (TaN), titanium nitride (TiN), or a combination thereof.

The mold insulating layers 220 may be disposed between the gate electrodes 230. The mold insulating layers 220 are spaced apart from each other in a direction, perpendicular to an upper surface of the upper substrate 201, and may be disposed to be extended to different lengths in an X-direction in a manner similar to the gate electrodes 230. The mold insulating layers 220 may include an insulating material, such as silicon oxide or silicon nitride.

The channel structures CHS may be spaced apart from each other and may be arranged in rows and columns on the upper substrate 201. The channel structures CHS may be disposed to form a lattice pattern on an X-Y plane or may be arranged in a zigzag form in one direction. The channel structures CHS may have a columnar shape and may have an inclined side surface. The channel structures CHS may have a diameter or width, which narrows toward the upper substrate 201.

Each of the channel structures CHS may include an epitaxial layer 261, a gate dielectric layer 263, a channel region 264, a channel insulating layer 267, and a channel pad 269. In the channel structures CHS, the channel region 264 may have an annular shape surrounding the channel insulating layer 267, formed therein. However, the channel region 264 may have a columnar shape without the channel insulating layer 267, such as a cylinder or a prism, according to an example embodiment. The channel region 264 may be electrically connected to the epitaxial layer 261, disposed therebelow. The epitaxial layer 261 may be disposed on the upper substrate 201 at a lower end of the channel structures CHS. The epitaxial layer 261 may be disposed in a recessed region of the upper substrate 201. A level of an upper surface of the epitaxial layer 261 may be higher than a lever of an upper surface of a lowermost gate electrode 230 and may be lower than a level of a lower surface of a gate electrode 230, directly above the lowermost gate electrode, relative to the lower substrate 101. In example embodiments, the epitaxial layer 261 may be omitted. In this case, the channel region 264 may be directly connected to the upper substrate 201. The channel pads 269 may be disposed to cover or overlap an upper surface of the channel insulating layer 267 and to be electrically connected to the channel region 264. The epitaxial layer 261 and the channel region 264 may include a semiconductor material such as polycrystalline silicon or single crystal silicon, and the semiconductor material may be an undoped material, or a material doped with a p-type or n-type impurity. The channel pads 269 may include, for example, doped polycrystalline silicon. The gate dielectric layer 263 may be disposed between the gate electrodes 230 and the channel region 264. The gate dielectric layer 263 may have an annular shape surrounding the channel region 264. The gate dielectric layer 263 may include a tunneling layer, a charge storage layer, and a blocking layer, sequentially stacked from the channel region 264. The tunneling layer may allow a charge to tunnel to the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 263 may be extended in a horizontal direction along the gate electrodes 230.

The first upper interlayer insulating layer 250 may be disposed to cover or overlap at least a portion of the upper substrate 201, the semiconductor pattern 210, and the gate electrodes 230 provided on the upper substrate 201. The second upper interlayer insulating layer 252 and the third upper interlayer insulating layer 254 may be stacked on the first upper interlayer insulating layer 250. The first upper interlayer insulating layer 250, the second upper interlayer insulating layer 252, and the third upper interlayer insulating layer 254 may be formed of an insulating material.

The semiconductor device 10 may further include a through region 260 disposed to pass through the upper substrate 201 and a cutting region 265 between the semiconductor patterns 210 so as to cut or separate the semiconductor patterns 210 from each other. The through region 260 may pass through the gate electrodes 230, the mold insulating layers 220, and the upper substrate 201 so as to be extended to an upper portion of the lower interlayer insulating layer 150. The through region 260 may be a region in which a first through plug 285 for connection of the memory cell region CELL and the peripheral circuit region PERI is provided. The through region 260 may be disposed between a region in which the channel structures CHS are provided and a region in which the gate contact plugs 281 are provided. The through region 260 may include an insulating material, and a first through plug 285 may be disposed therein. The first through plug 285 may be electrically connected to the circuit elements 120 through the lower wiring structure 130. The first through plug 285 may be connected to a gate contact plug 281, a channel structure CHS, and the like through an upper wiring structure (not shown). A sidewall of the through region 260 may have a shape, which is inclined and of which a width narrows downwardly. For example, a lower surface of the through region 260 may be narrower than an upper surface thereof, and an upper width of the through region 260 may be greater than a lower width thereof. The second through plugs 287 may be formed between the cutting regions 265 and may be electrically connected to the circuit elements 120 while passing through the first upper interlayer insulating layer 250.

The cutting region 265 may pass through the first upper interlayer insulating layer 250, the second upper interlayer insulating layer 252, and the third upper interlayer insulating layer 254, as well as the semiconductor pattern 210 so as to be extended to an upper portion of the lower interlayer insulating layer 150.

The cutting region 265 may be located between the upper substrates 201. The cutting region 265 may include an insulating material.

A lower surface of the through region 260 and a lower surface of the cutting region 265 may be located lower than a lower surface of the upper substrate 201 relative to the lower substrate 101. The through region 260 and the cutting region 265 may be formed using different etching processes, and levels of lower surfaces thereof may be different from each other.

A height of the cutting region 265 may be greater than a height of the through region 260. An upper surface of the cutting region 265 may be located higher than an upper surface of the through region 260 relative to the lower substrate 101.

A sidewall of the cutting region 265 may have a shape, which is inclined and of which a width narrows downwardly toward the lower substrate 101. For example, a lower surface of the cutting region 265 may be narrower than an upper surface thereof, and an upper width of the cutting region 265 may be wider than a lower width thereof. Moreover, a height of the cutting region 265 may be greater than a height of the channel structures CHS. An upper surface of the cutting region 265 may be located higher than an upper surface of the channel structure CHS relative to the lower substrate 101. However, a shape of the cutting region 265 and a relative size of the cutting region 265 and the through region 260 are not limited to those illustrated in the drawings, and may be variously changed in example embodiments.

The semiconductor device 10 may further include separation regions SR dividing and intersecting the gate electrodes 230 of the memory cell regions CELL in an X-direction. The separation region SR includes an insulating layer 273 and a conductive layer 275, and the conductive layer 275 is a common source line for driving memory cells. Impurity regions 271 may be disposed below the separation regions SR, respectively, in the upper substrate 201.

A portion of the separation regions SR may include a portion divided to at least partially surround the through regions 260.

Figure 4:
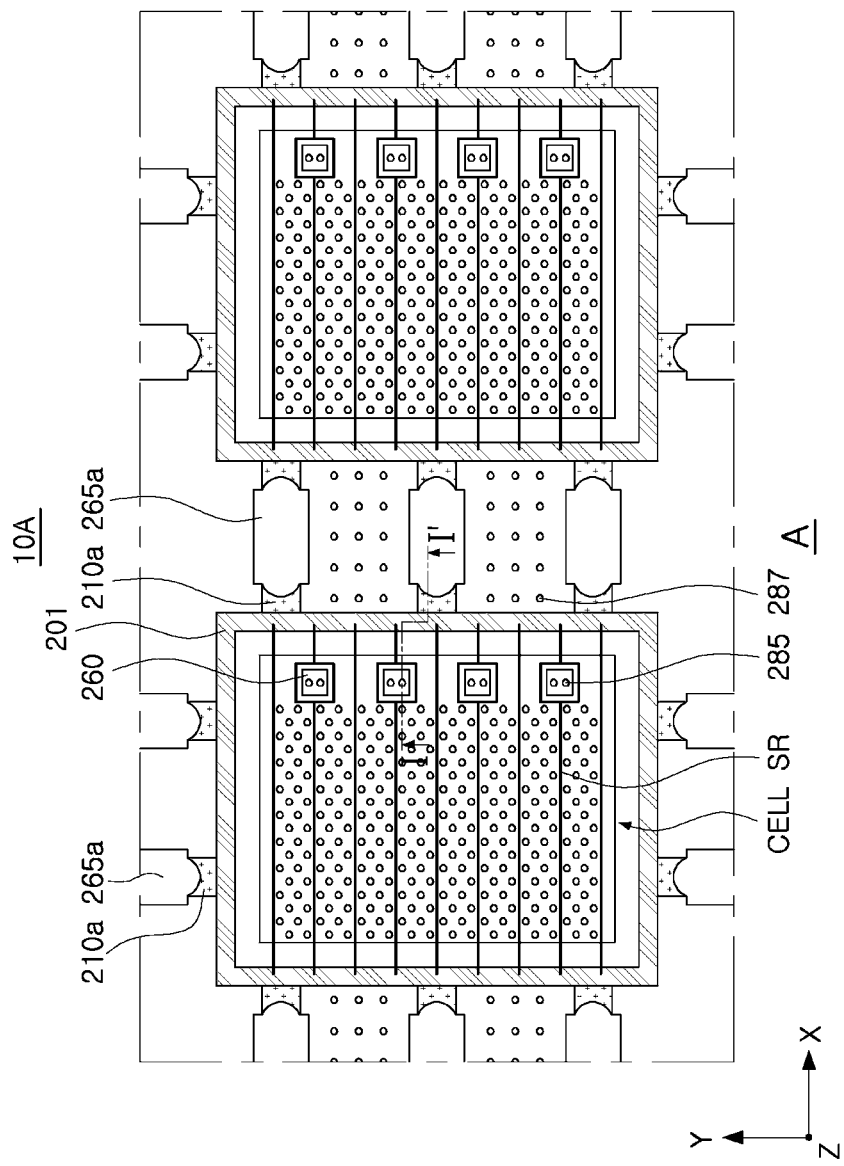
FIG. 4 is a schematic plan view illustrating a portion of a semiconductor device according to an example embodiment of the inventive concept, and illustrates a region corresponding to FIG. 2.
Figure 5:
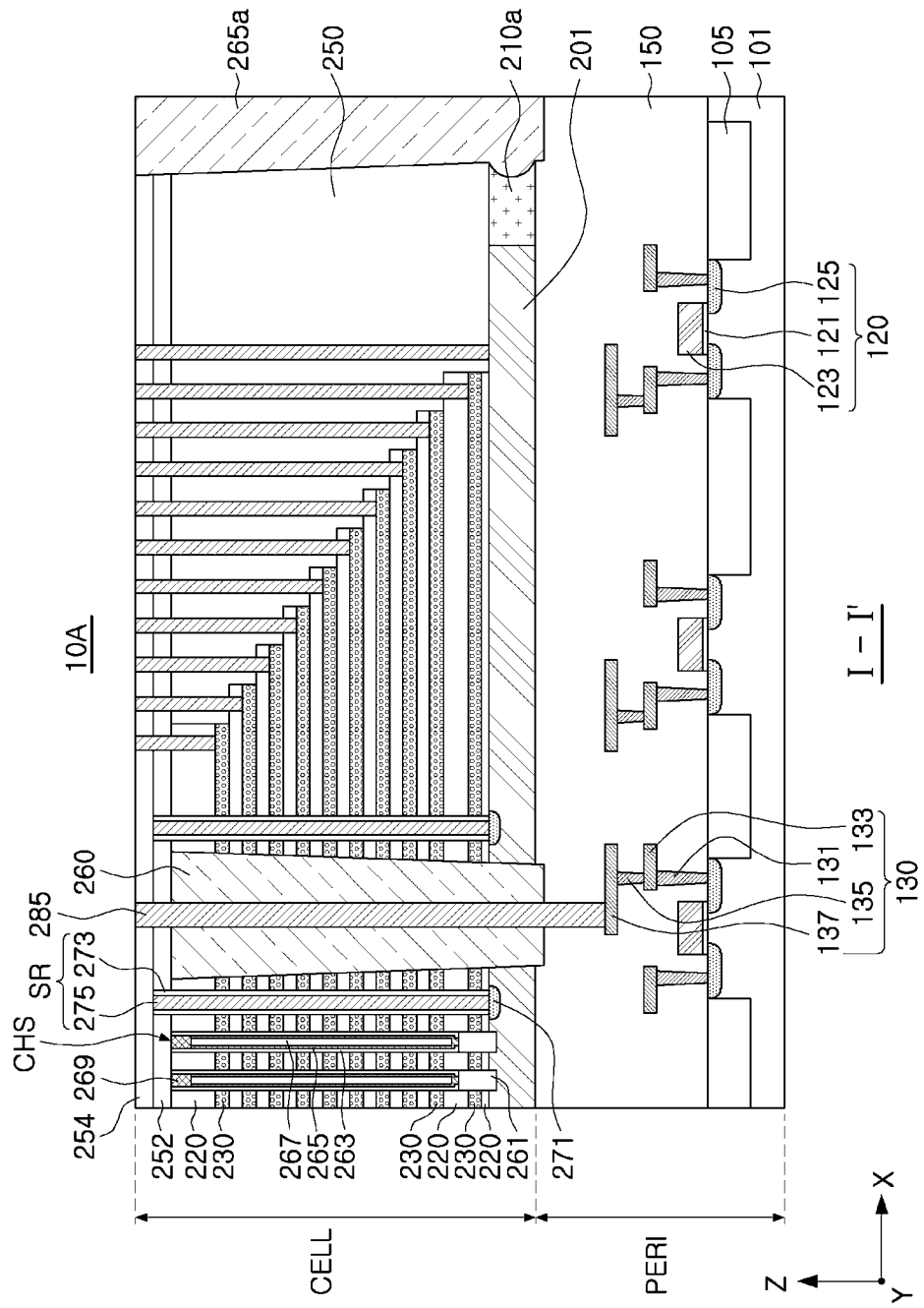
FIG. 5 is a schematic cross-sectional view of a semiconductor device according to an example embodiment of the inventive concept.

FIG. 4 is a schematic plan view illustrating a portion of a semiconductor device according to an example embodiment of the inventive concept, and illustrates a region corresponding to FIG. 2. FIG. 5 is a schematic cross-sectional view of a semiconductor device according to an example embodiment of the inventive concept, and a cross-sectional view taken along line I-I' of FIG. 4.

Referring to FIGS. 4 and 5, in a semiconductor device 10A in the example embodiment, a semiconductor pattern 210a may have a concave groove in contact with the cutting region 265a, in a manner different from the semiconductor device 10 of FIGS. 1 to 3. The cutting region 265a may include a contact portion (a protruding portion) in contact with the concave groove of the semiconductor pattern 210a, and the contact portion (the protruding portion) may include a convex curved surface.

The cutting region 265a may be provided by forming an opening passing through the first upper interlayer insulating layer 250, the second upper interlayer insulating layer 252, and the third upper interlayer insulating layer 254, as well as the semiconductor pattern 210a using an anisotropic dry etching process, and then removing a portion of the semiconductor pattern 210a using an additional wet etching process, as will be described with reference to FIG. 26. The wet etching process may be performed by an etching solution configured to etch, for example, polycrystalline silicon.

Figure 6:
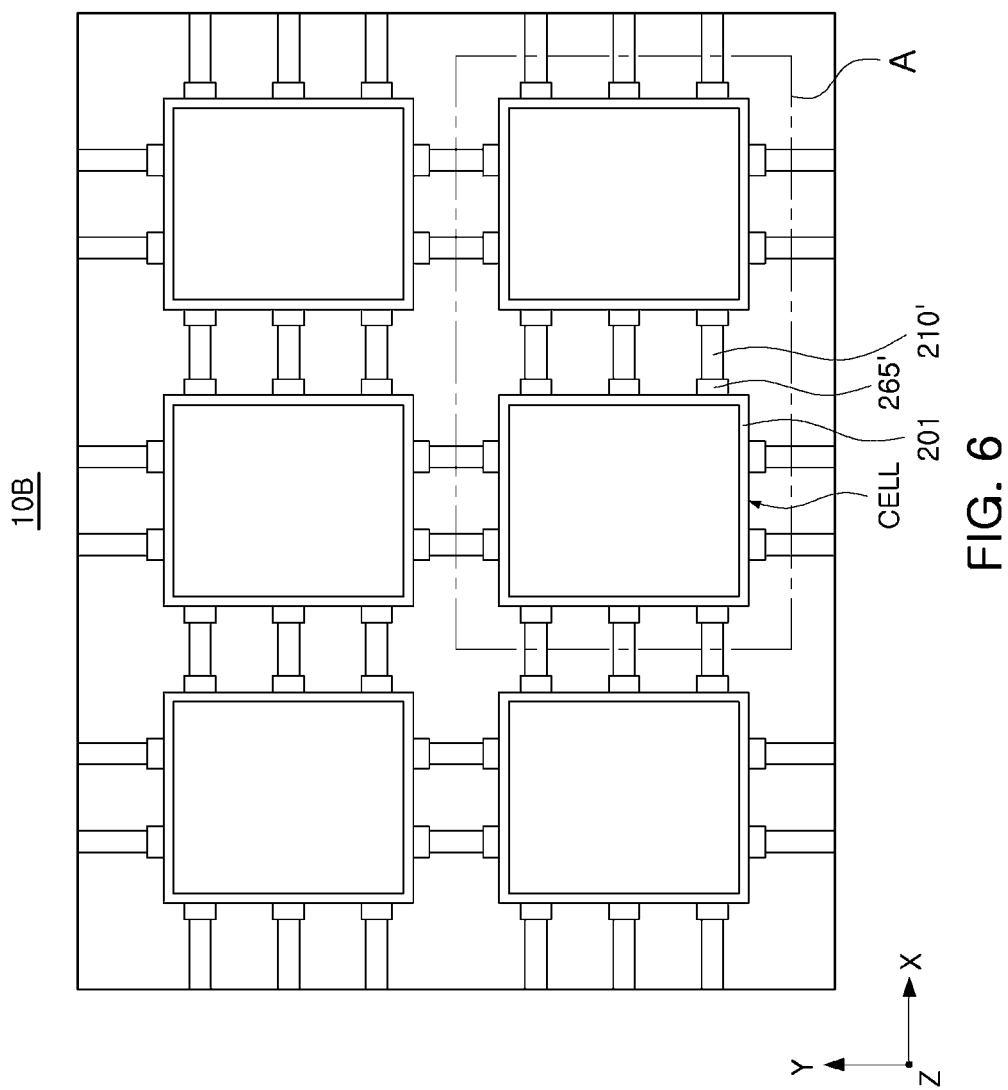
FIG. 6 is a schematic plan view of a semiconductor device according to an example embodiment of the inventive concept.
Figure 7:
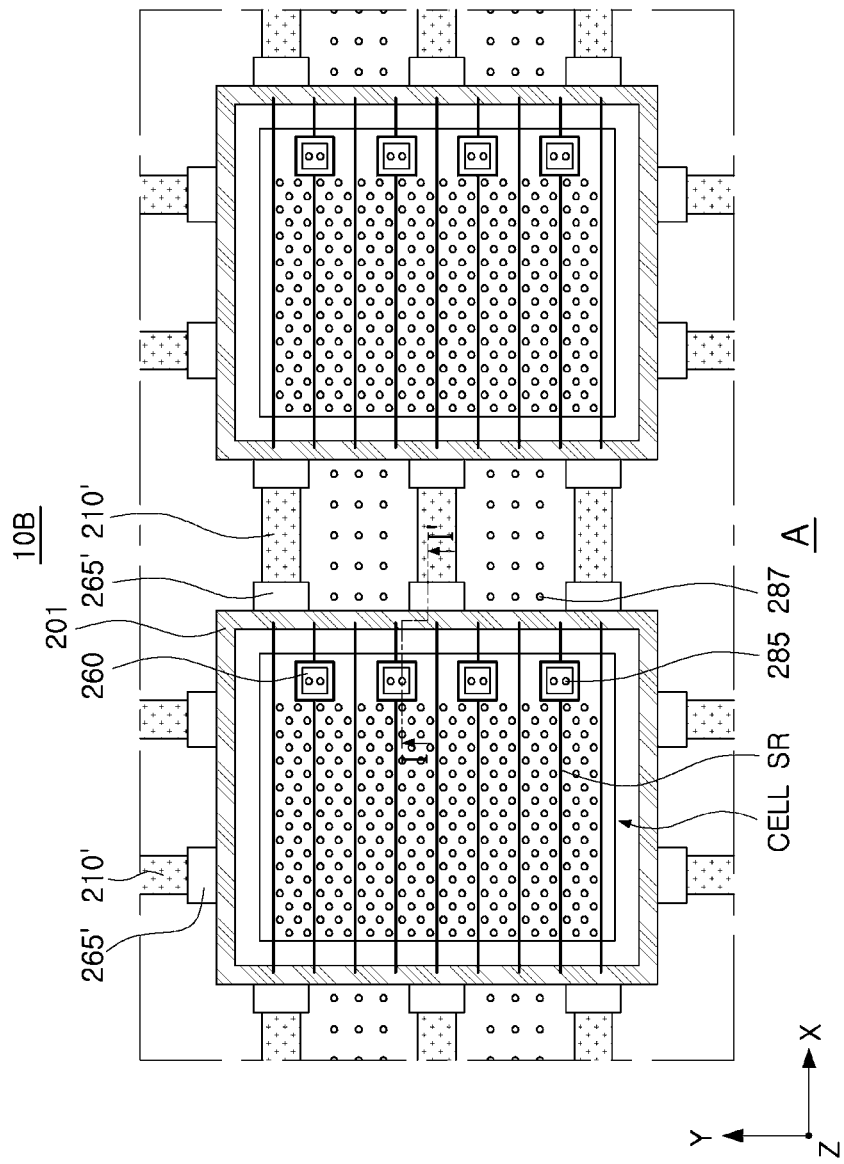
FIG. 7 is an enlarged view of region 'A' of FIG. 6.
Figure 8:
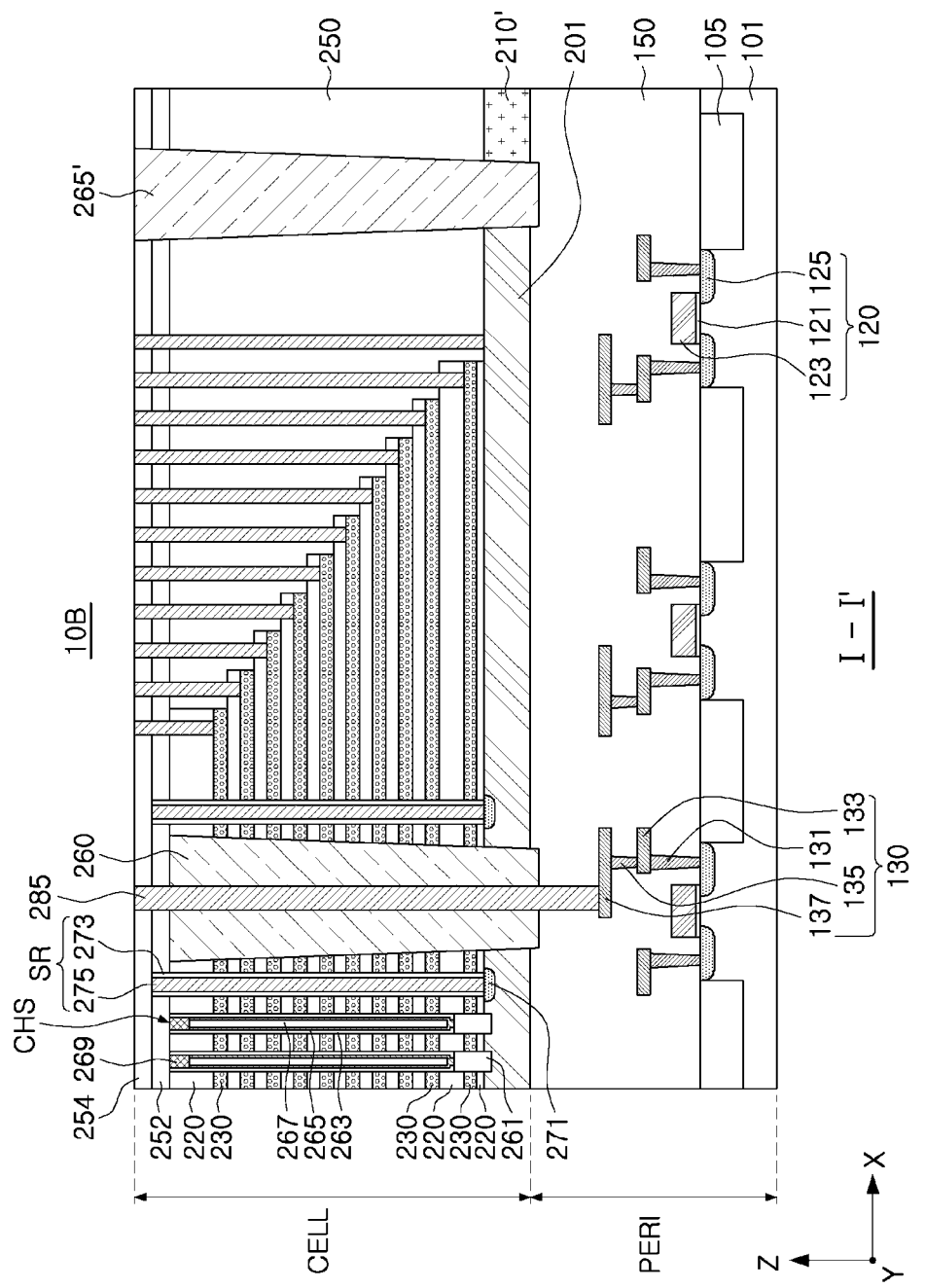
FIG. 8 is a schematic cross-sectional view of a semiconductor device according to an example embodiment of the inventive concept, and a cross-sectional view taken along line I-I' of FIG. 7.

FIG. 6 is a schematic plan view of a semiconductor device according to an example embodiment of the inventive concept. FIG. 7 is an enlarged view of region 'A' of FIG. 6. FIG. 8 is a schematic cross-sectional view of a semiconductor device according to an example embodiment of the inventive concept, and a cross-sectional view taken along line I-I' of FIG. 7.

Referring to FIGS. 6, 7 and 8, a semiconductor device 10B according to the example embodiment may include semiconductor patterns 210' disposed between upper substrates 201 and spaced apart from the upper substrates 201. Cutting regions 265' may be disposed between the upper substrates 201 and the semiconductor patterns 210'. Each of the cutting regions 265' may be in contact with the upper substrate 201 and the semiconductor patterns 210'. The upper substrate 201 and the semiconductor pattern 210' may be electrically insulated by the cutting region 265'. As a result, the upper substrates 201 may be electrically insulated by the cutting region 265'.

Figure 9:
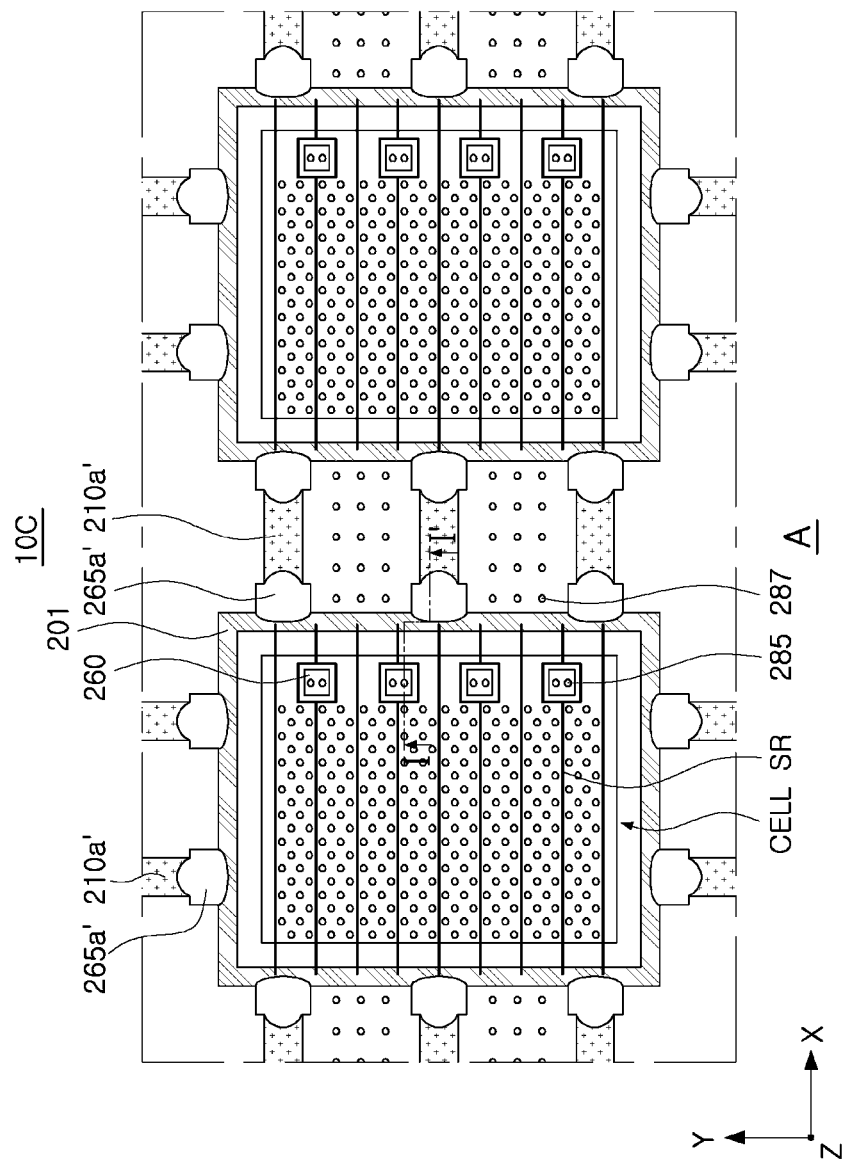
FIG. 9 is a schematic plan view illustrating a portion of a semiconductor device according to an example embodiment of the inventive concept, and illustrates a region corresponding to FIG. 7.
Figure 10:
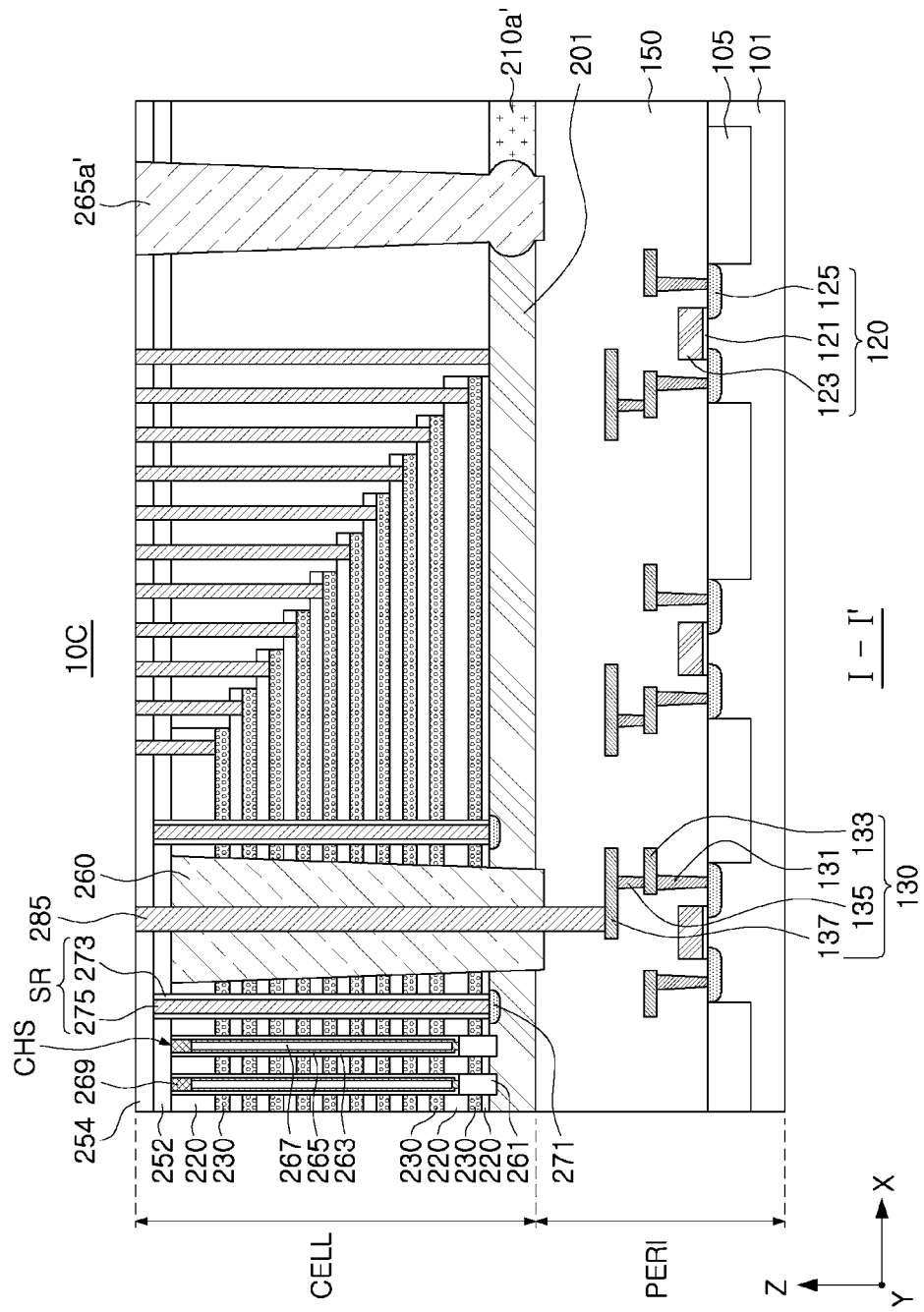
FIG. 10 is a schematic cross-sectional view of a semiconductor device according to an example embodiment of the inventive concept.

FIG. 9 is a schematic plan view illustrating a portion of a semiconductor device according to an example embodiment of the inventive concept, and illustrates a region corresponding to FIG. 7. FIG. 10 is a schematic cross-sectional view of a semiconductor device according to an example embodiment of the inventive concept, and a cross-sectional view taken along line I-I' of FIG. 9.

Referring to FIGS. 9 and 10, in a manner different from the semiconductor device 10B of FIGS. 6 to 8, in a semiconductor device 10C according to the example embodiment, a semiconductor pattern 210a' may have concave first grooves in contact with cutting regions 265a'. An upper substrate 201 may also have concave second grooves in contact with the cutting regions 265a'. The cutting region 265a may include contact portions (protruding portions) in contact with the first groove of the semiconductor pattern 210a' and the second groove of the upper substrate 201, and the contact portions (the protruding portions) may include a convex curved surface.

FIGS. 11 to 14 are schematic plan views illustrating a portion of a semiconductor device according to example embodiments of the inventive concept.

Figure 11:
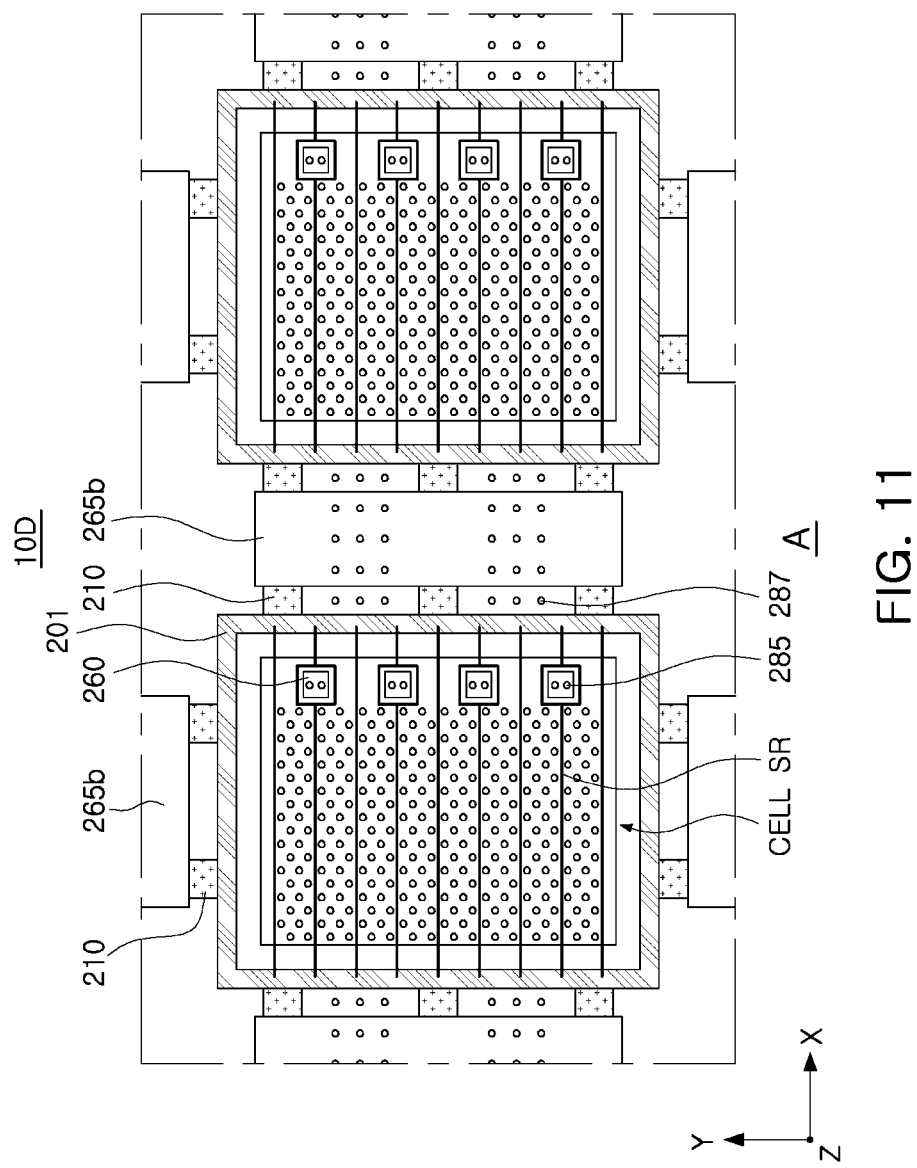
FIGS. 11 to 14 are schematic plan views illustrating a portion of a semiconductor device according to example embodiments of the inventive concept.

Referring to FIG. 11, in a manner different from the semiconductor device 10 of FIGS. 1 to 3, a semiconductor device 10D according to the example embodiment may include a single cutting region 265b between neighboring upper substrates 201. Three semiconductor patterns 210, protruding from the upper substrate 201, may be in contact with a single cutting region 265b.

Figure 12:
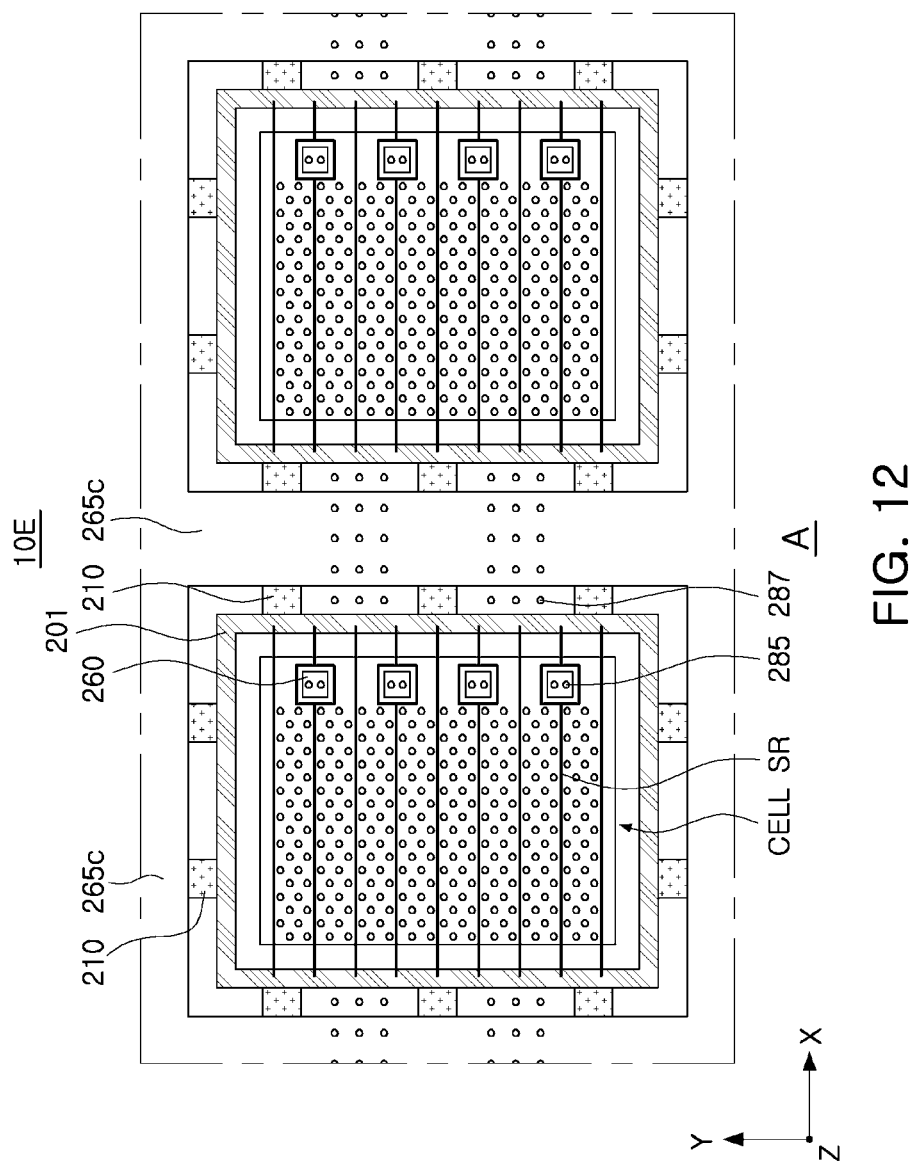

Referring to FIG. 12, in a manner different from the semiconductor device 10 of FIGS. 1 to 3, a semiconductor device 10E according to the example embodiment may include a cutting region 265c at least partially surrounding upper substrates 201. The cutting region 265c may be in contact with all the semiconductor patterns 210 protruding from the upper substrates 201.

Figure 13:
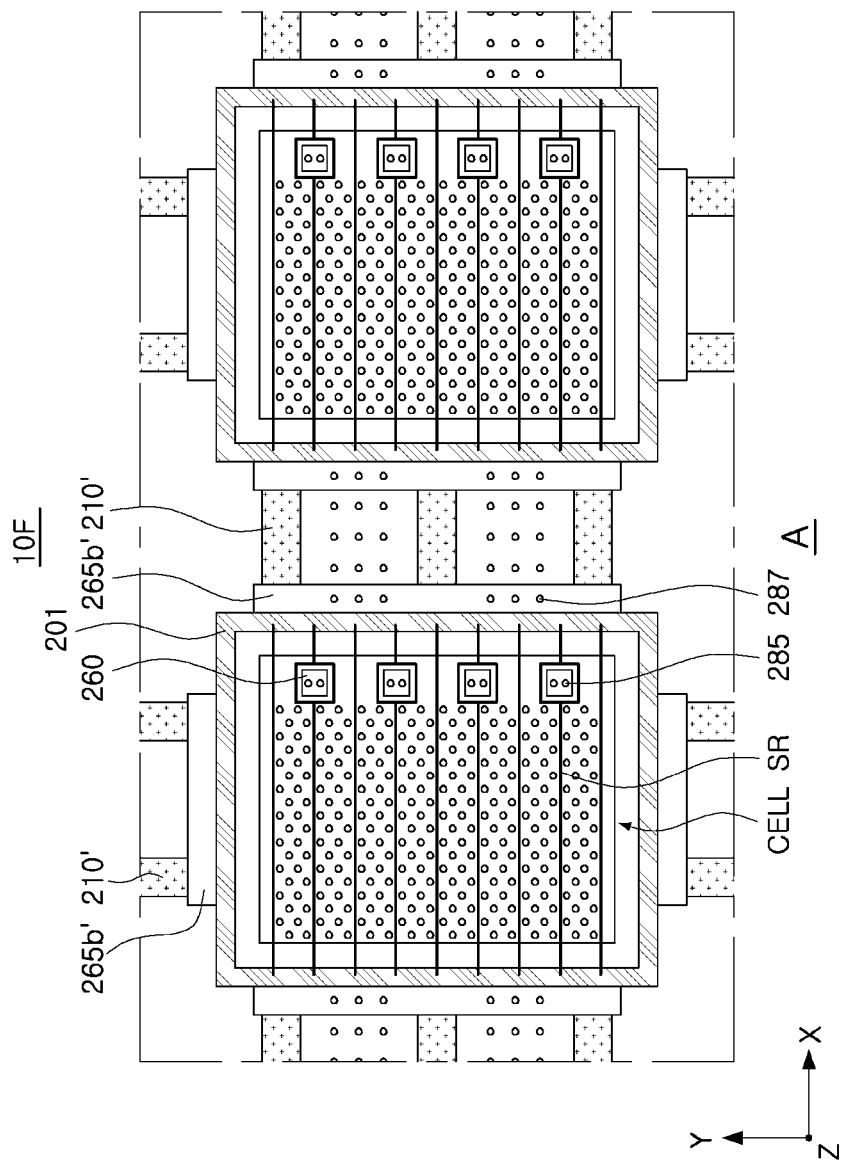

Referring to FIG. 13, in a manner different from the semiconductor device 10B of FIGS. 6 to 7, in a semiconductor device 10F according to the example embodiment, three semiconductor patterns 210', disposed between neighboring upper substrates 201, may be in contact with a single cutting region 265b'.

A single cutting region 265b' between the upper substrate 201 and three semiconductor patterns 210' may be disposed on a side surface of the upper substrate 201. The cutting region 265b' may be disposed on each of four side surfaces of the upper substrate 201.

Figure 14:
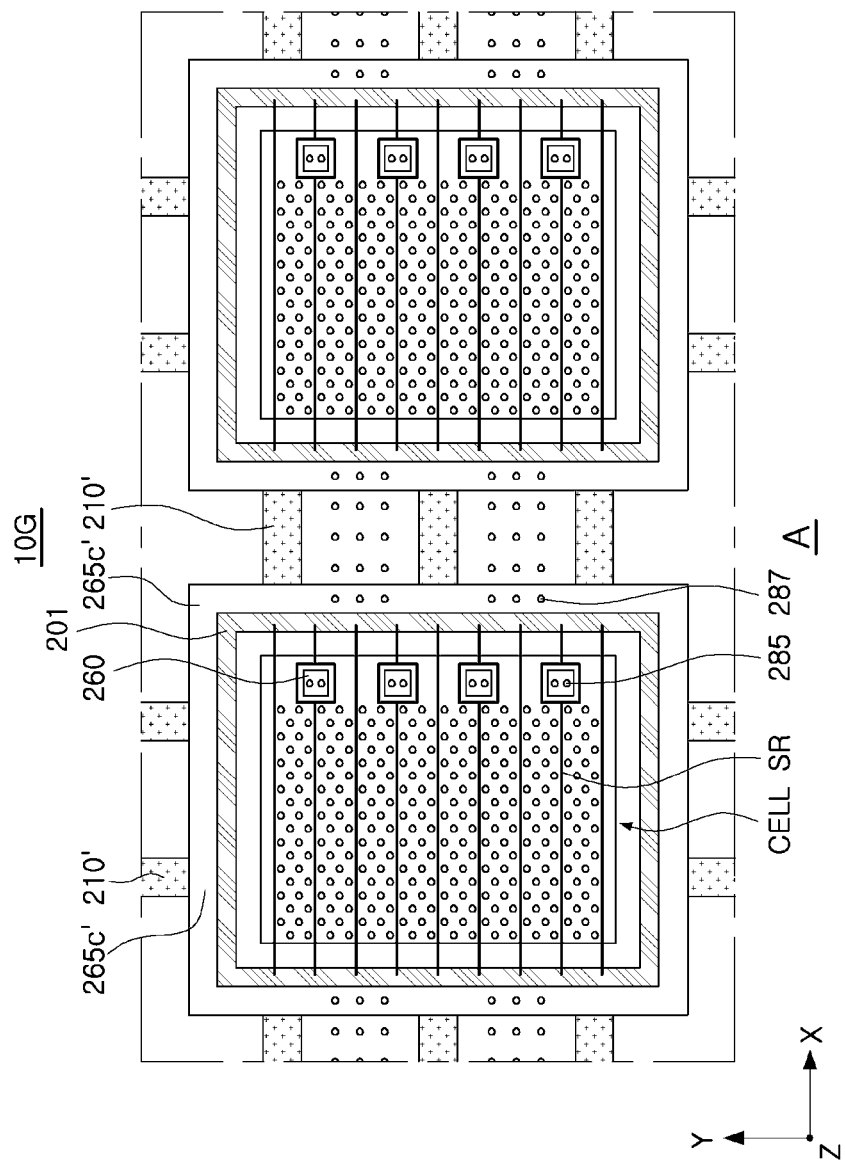

Referring to FIG. 14, in a manner different from the semiconductor device 10B of FIGS. 6 to 7, a semiconductor device 10G according to the example embodiment may include cutting regions 265c' at least partially surrounding upper substrates 201, respectively. The cutting region 265c' may be in contact with some or all side surfaces of the upper substrate 201, and may be in contact with the semiconductor patterns 210'.

Figure 15:
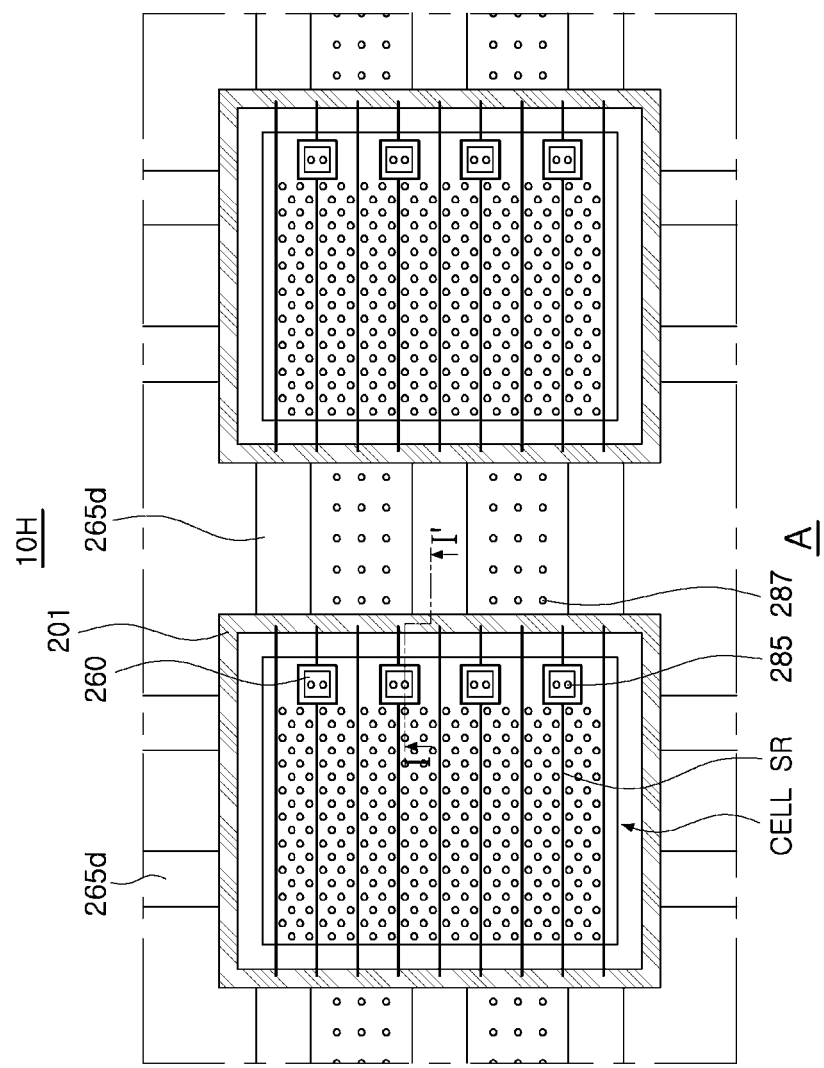
FIG. 15 is a schematic plan view illustrating a portion of a semiconductor device according to an example embodiment of the inventive concept.
Figure 16:
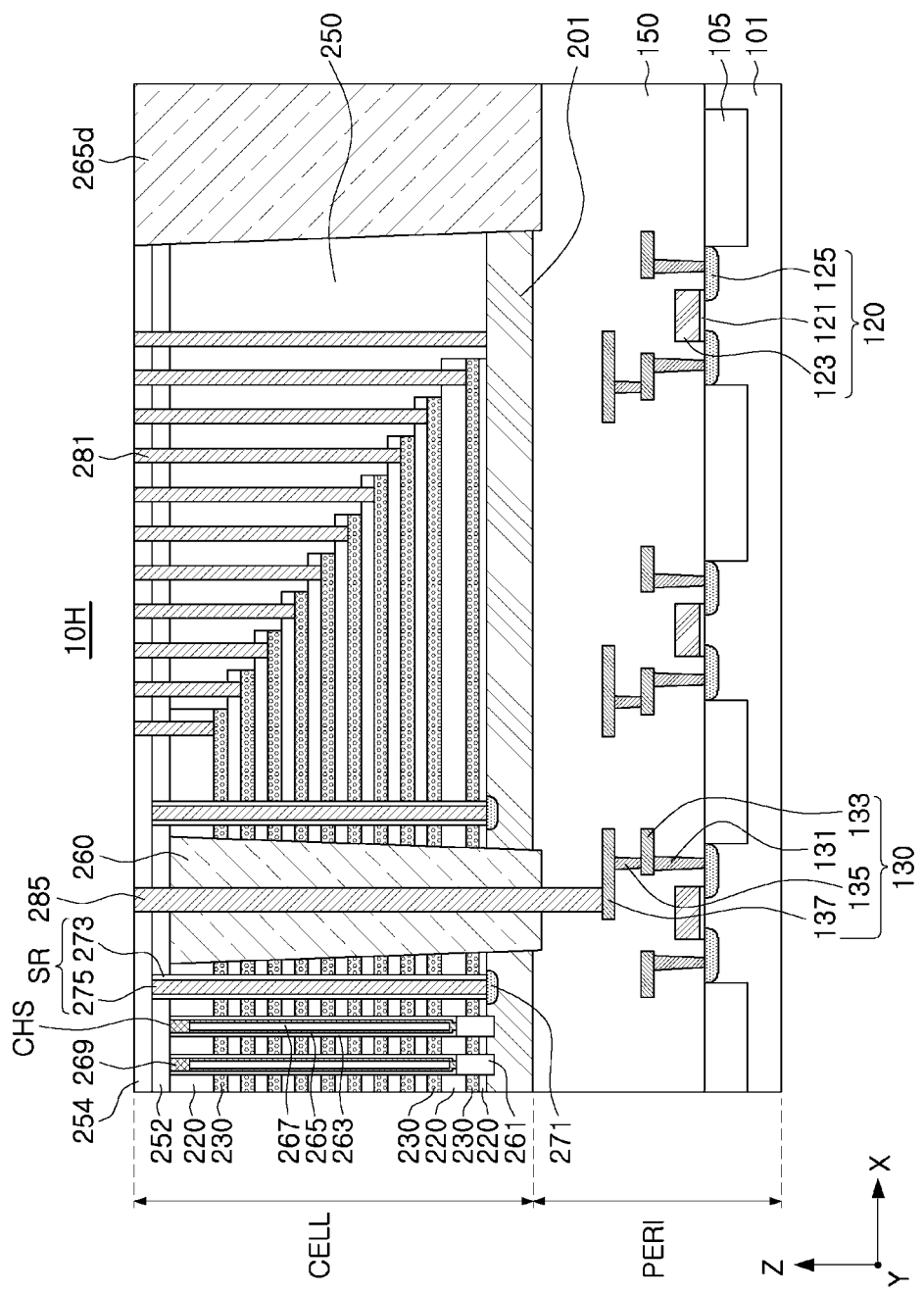
FIG. 16 is a schematic cross-sectional view of a semiconductor device according to an example embodiment of the inventive concept, and a cross-sectional view taken along line I-I' of FIG. 15.

FIG. 15 is a schematic plan view illustrating a portion of a semiconductor device according to an example embodiment of the inventive concept. FIG. 16 is a schematic cross-sectional view of a semiconductor device according to an example embodiment of the inventive concept, and a cross-sectional view taken along line I-I' of FIG. 15.

Referring to FIGS. 15 and 16, a semiconductor device 10H according to the example embodiment may include cutting regions 265d, disposed between neighboring upper substrates 201, and in contact with the upper substrates 201. In the semiconductor device 10H according to the example embodiment, semiconductor patterns are not present between the upper substrates 201.

Figure 17:
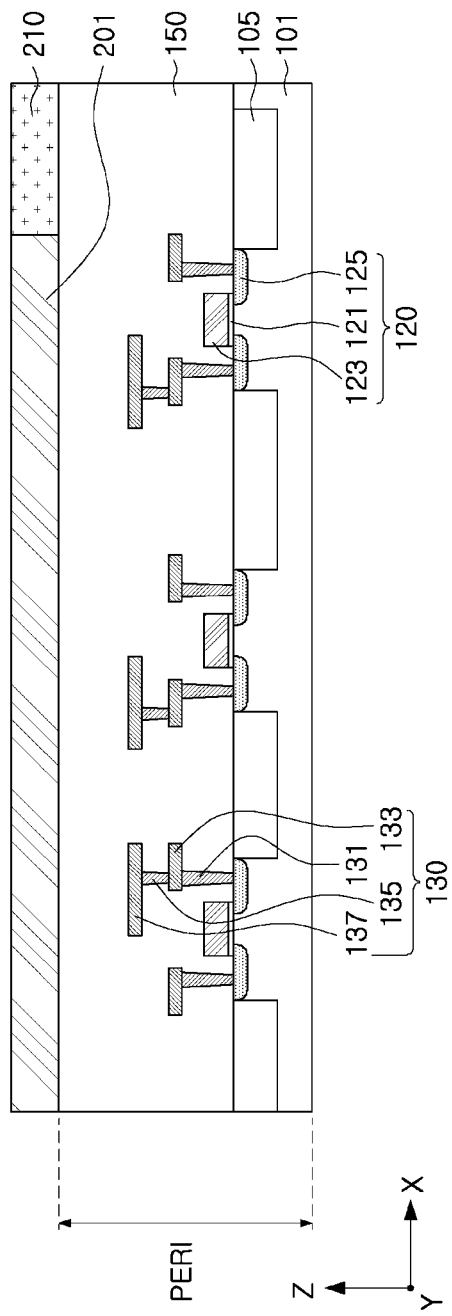
FIGS. 17 to 26 are schematic cross-sectional views illustrating a method for manufacturing a semiconductor device according to an example embodiment of the inventive concept.
Figure 18:
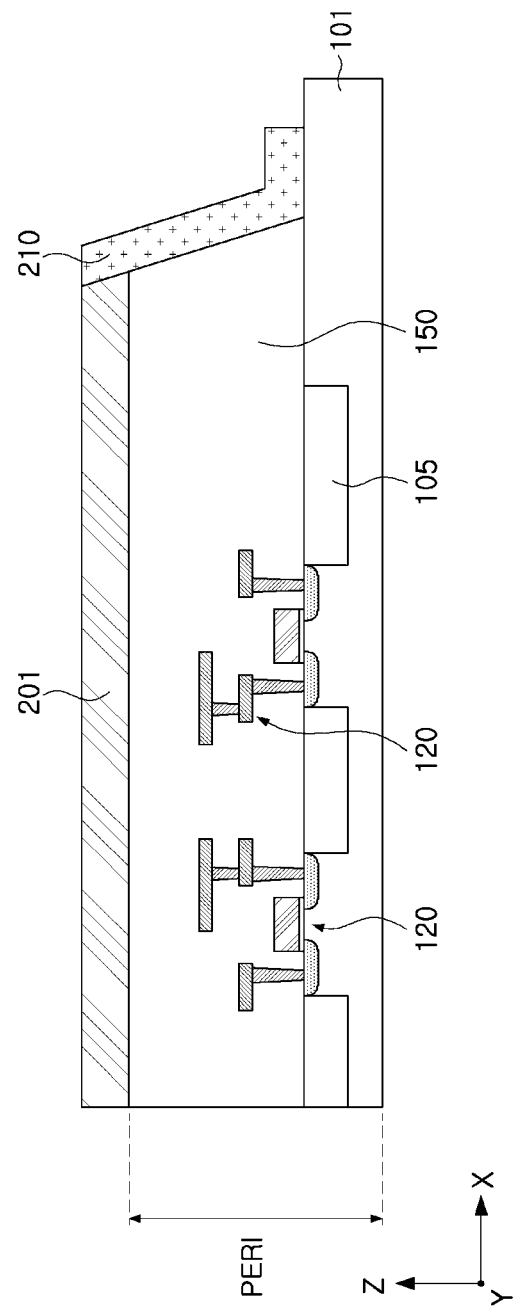
Figure 20:
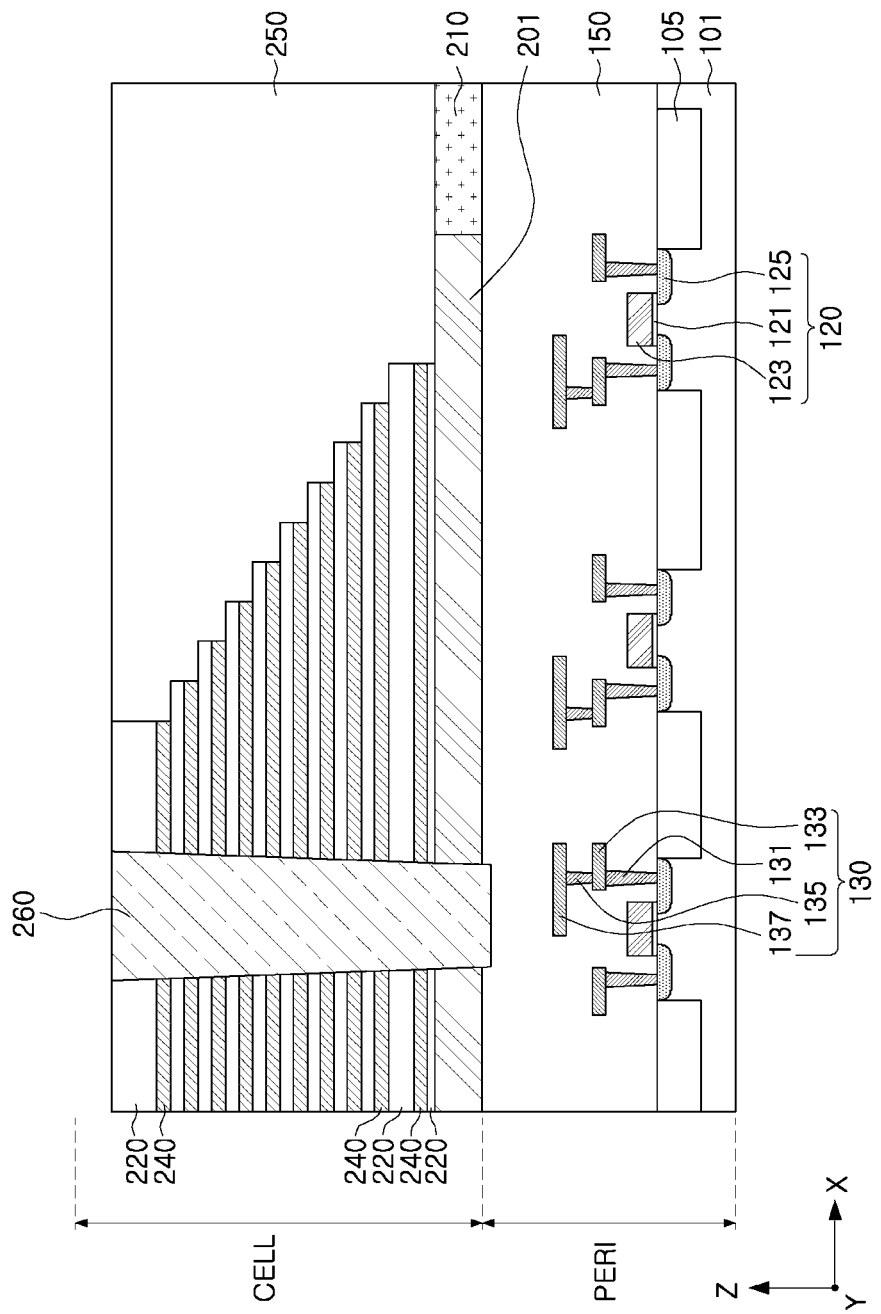
Figure 21:
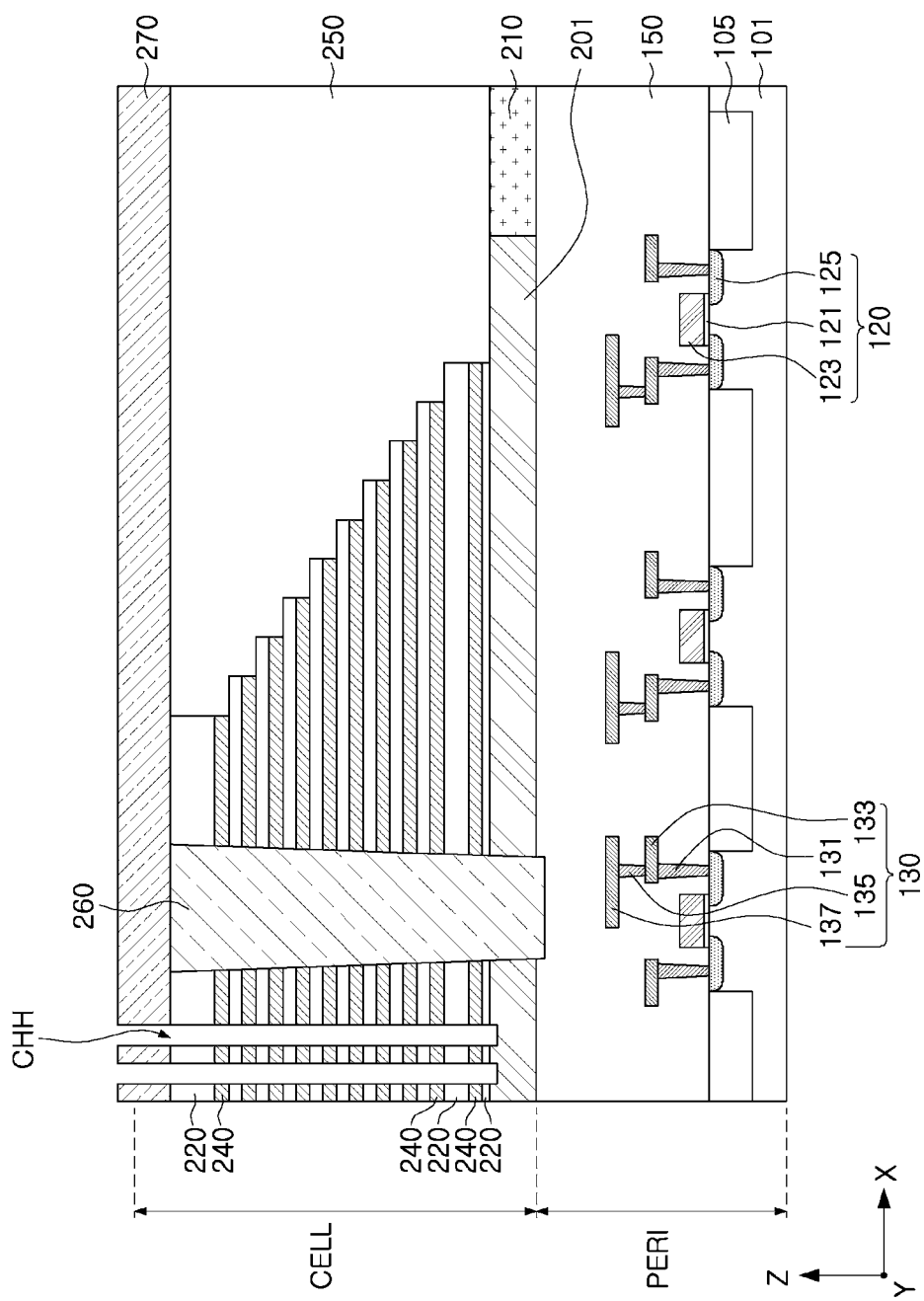
Figure 22:
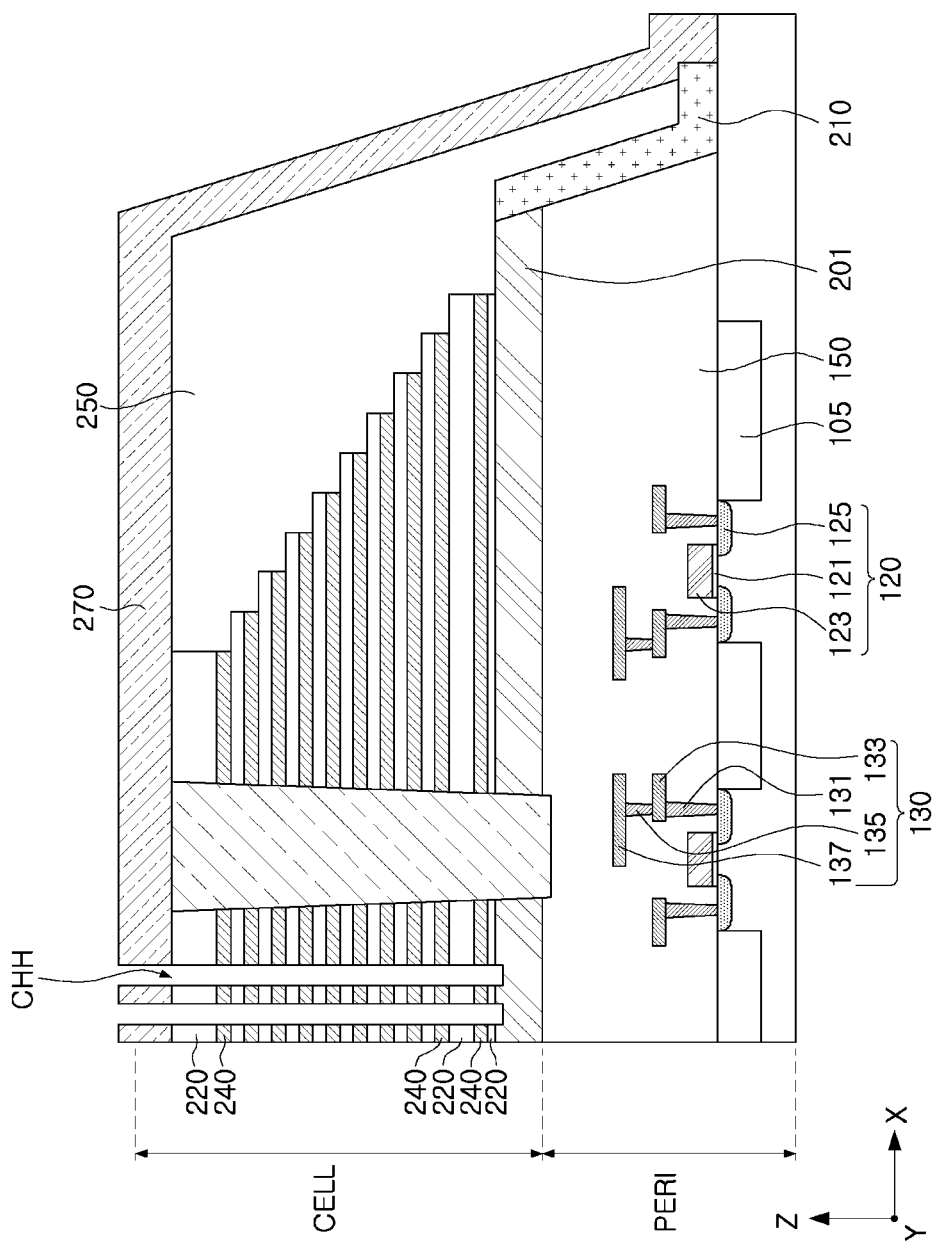

FIGS. 17 to 26 are schematic cross-sectional views illustrating a method for manufacturing a semiconductor device according to example embodiments of the inventive concept. In FIGS. 17, 19 to 21, and 23 to 26, regions corresponding to the region illustrated in FIG. 3 are illustrated therein. In FIGS. 18 and 22, an edge region of a lower substrate 101 is illustrated therein.

Referring to FIGS. 17 and 18, circuit elements 120 and lower wiring structures 130 may be provided on the lower substrate 101. An element isolation region 105 may be provided between the circuit elements 120.

First, a circuit gate dielectric layer 121 and a circuit gate electrode layer 123 may be formed on the lower substrate 101. The circuit gate dielectric layer 121 may be formed of silicon oxide, and the circuit gate electrode layer 123 may be formed of polycrystalline silicon, metal silicide, and/or metal, but example embodiments are not limited thereto. Then, source/drain regions 125 may be formed in upper portions of the lower substrate 101 at both sides of the circuit gate electrode layer 123.

Lower wiring structures 130 and a lower interlayer insulating layer 150 may be formed on the lower substrate 101. The lower wiring structures 130 may include a first lower contact plug 131, a first lower wiring line 133, a second lower contact plug 135, and a second lower wiring line 137. The lower interlayer insulating layer 150 may be formed of a plurality of insulating layers.

Moreover, on the lower interlayer insulating layer 150, an upper substrate 201 and a semiconductor pattern 210 extended from the upper substrate 201 may be provided thereon. FIG. 18 illustrates an edge region of the lower substrate 101. In the edge region of the lower substrate 101, the semiconductor pattern 210 is extended along a side surface of the lower interlayer insulating layer 150, and may be in contact with the lower substrate 101.

The upper substrate 201 and the semiconductor pattern 210 may be formed of, for example, polycrystalline silicon. The upper substrate 201 may include, for example, a p-type impurity. The upper substrate 201 may be disposed to have a size smaller than that of the lower substrate 101.

Figure 19:
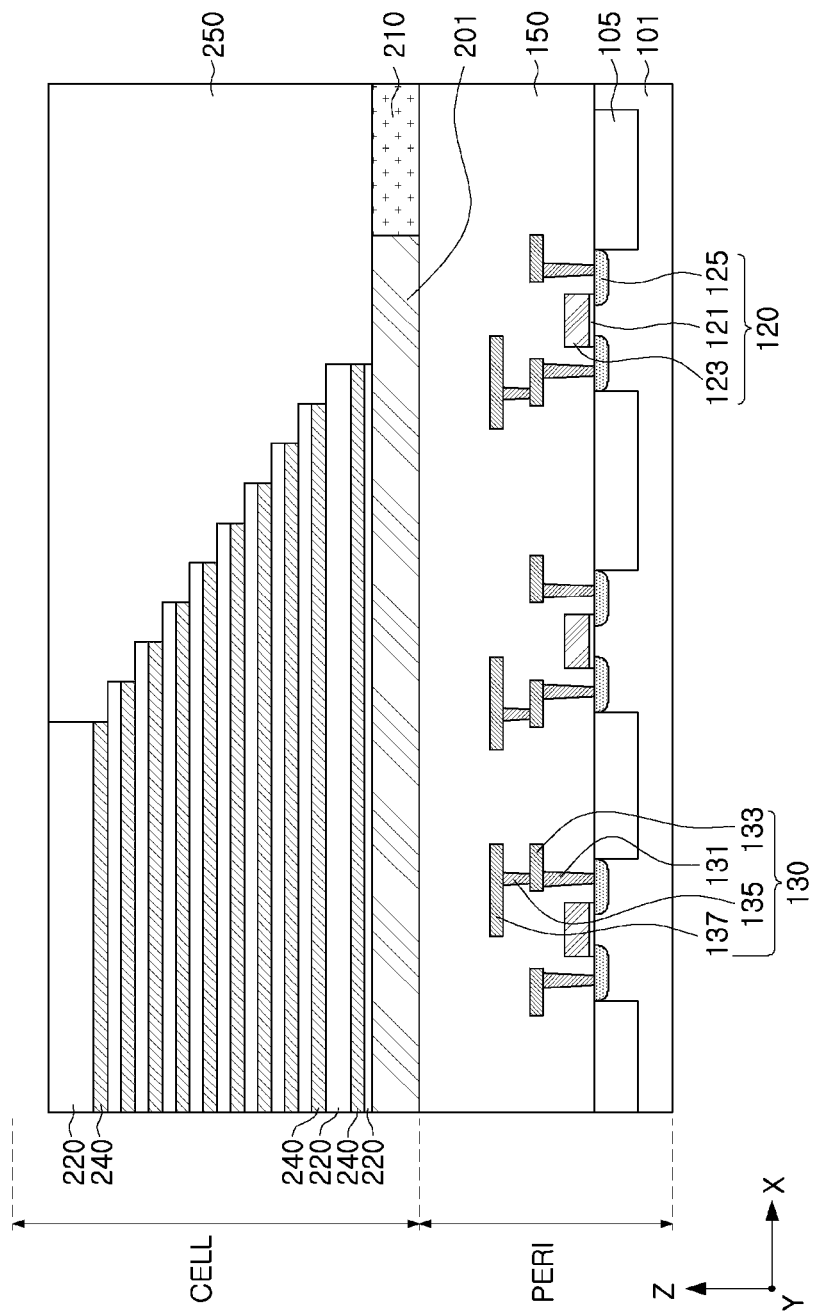

Referring to FIG. 19, on the upper substrate 201, sacrificial layers 240 and mold insulating layers 220 are alternately stacked, and portions of the sacrificial layers 240 and the mold insulating layers 220 may be removed to be extended at different lengths in an X-direction, by repeatedly performing a photolithography process and etching process. Thus, the sacrificial layers 240 and the mold insulating layers 220 may have a stepped form.

The sacrificial layers 240 may be layers to be replaced with the gate electrodes 230 through a subsequent process. The sacrificial layers 240 may be formed of a material to be etched while having etch selectivity to the mold insulating layers 220. For example, the mold insulating layer 220 may be formed of silicon oxide and/or silicon nitride, and the sacrificial layers 240 may be formed of a material, different from the mold insulating layer 220, and may comprise silicon, silicon oxide, silicon carbide, and/or silicon nitride. A portion of the mold insulating layers 220 may have a thickness different from that of the remaining portion.

Next, a stacked structure of the sacrificial layers 240 and the mold insulating layers 220, and a first upper interlayer insulating layer 250 at least partially covering the upper substrate 201 and the semiconductor pattern 210, may be provided.

Referring to FIG. 20, a through region 260, passing through the stacked structure of sacrificial layers 240 and mold insulating layers 220, and an upper substrate 201 may be provided.

An opening passing through the stacked structure of the sacrificial layers 240 and the mold insulating layers 220, and the upper substrate 201 to expose a lower interlayer insulating layer 150 is formed, and the opening is filled with an insulating material to form a through region 260. An upper surface of the through region 260 may be coplanar with an upper surface of an uppermost sacrificial layer 240.

Referring to FIGS. 21 and 22, channel holes CHH, passing through a stacked structure of sacrificial layers 240 and mold insulating layers 220, may be provided.

A mask layer 270, including hard mask layers, an amorphous carbon layer (ACL), and the like are provided on the mold insulating layers 220, the through region 260, and the first upper interlayer insulating layer 250 to form the channel holes CHH. Referring to FIG. 22, in an edge region of the lower substrate 101, the semiconductor pattern 210 may be extended along a side surface of the lower interlayer insulating layer 150 to be in contact with the lower substrate 101. Moreover, the mask layer 270 may be extended along a side surface of the first upper interlayer insulating layer 250 to be in contact with the lower substrate 101.

The channel holes CHH may have a form of a hole having a high aspect ratio, and may be formed using an anisotropic etching process. Due to a height of the stacked structure, that is, due to a high aspect ratio, a sidewall of the channel holes CHH may not be perpendicular to an upper surface of the upper substrate 201. In example embodiments, the channel holes CHH may be formed to allow a portion of the upper substrate 201 to be recessed.

When a plasma dry etching process is used during formation of the channel holes CHH, a potential difference between an upper portion and a lower portion of the channel holes CHH may occur by positive ions and electrons. However, in example embodiments, the upper substrate 201 is connected to the lower substrate 101 by the semiconductor pattern 210 to allow the positive ions to flow to the lower substrate 101, and the electrons may flow to the lower substrate 101 through the mask layer 270, thereby preventing or reducing the likelihood of an arcing defect caused by the potential difference.

Figure 23:
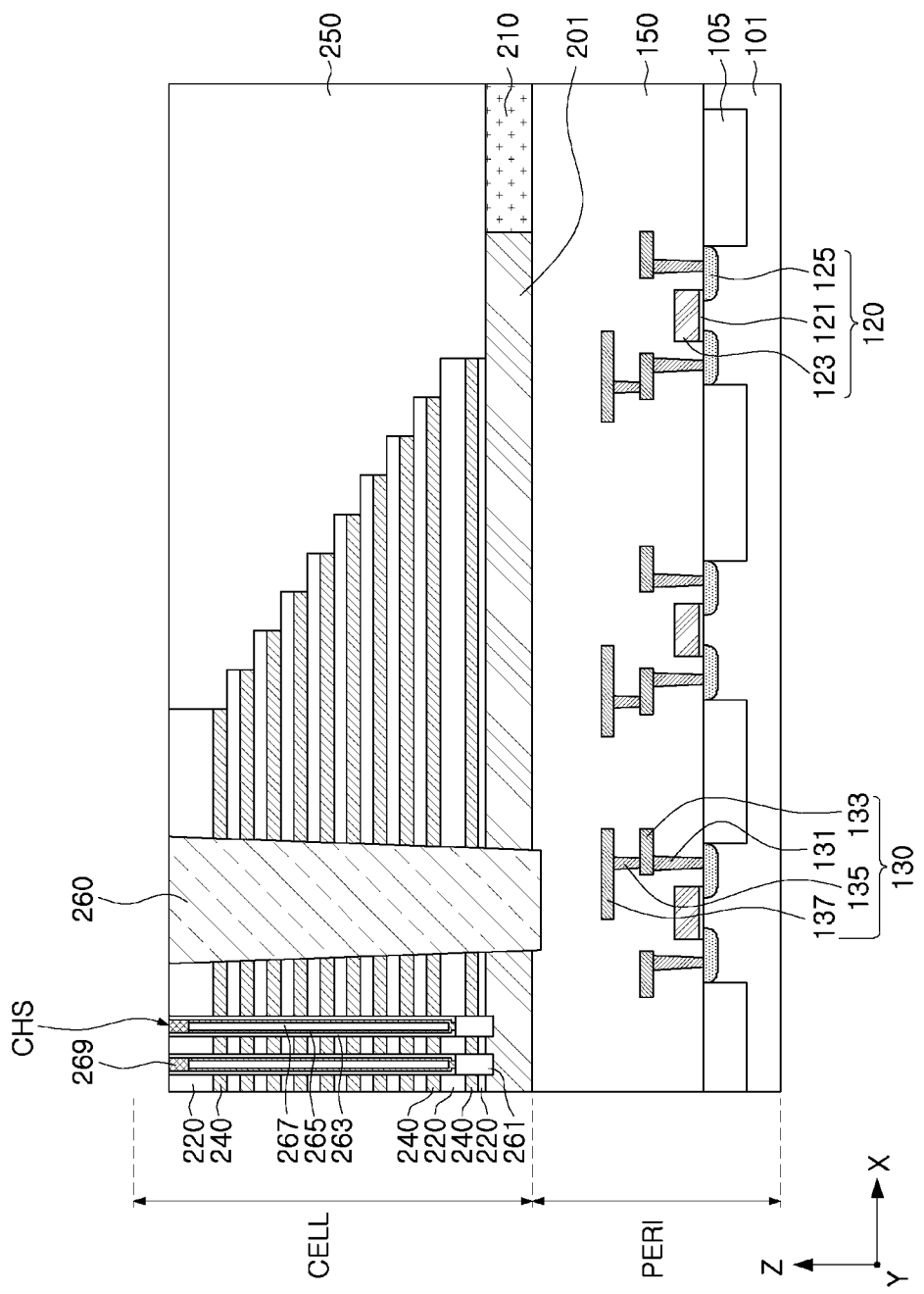

Referring to FIG. 23, an epitaxial layer 261, a gate dielectric layer 263, a channel region 264, a channel insulating layer 267, and a channel pad 269 are formed in the channel holes CHH, to form channel structures CHS.

The epitaxial layer 261 may be formed using a selective epitaxial growth (SEG) process. The epitaxial layer 261 may be formed of a single layer or a plurality of layers. The epitaxial layer 261 may include polycrystalline silicon, monocrystalline silicon, polycrystalline germanium, and/or monocrystalline germanium, doped with an impurity or undoped. The gate dielectric layer 263 may be formed to have a uniform thickness using ALD or CVD. The channel region 264 may be provided on the gate dielectric layer 245 in the channel holes CHH, and a lower portion of the channel region 264 may pass through the gate dielectric layer 245 to be connected to the epitaxial layer 261. The channel insulating layer 267 may be formed to fill an internal space of the channel region 264, and may be an insulating material. However, according to example embodiments, rather than the channel insulating layer 267, a conductive material may fill the internal space of the channel regions 264. The channel pad 269 may be formed of a conductive material, for example, polycrystalline silicon.

Figure 24:
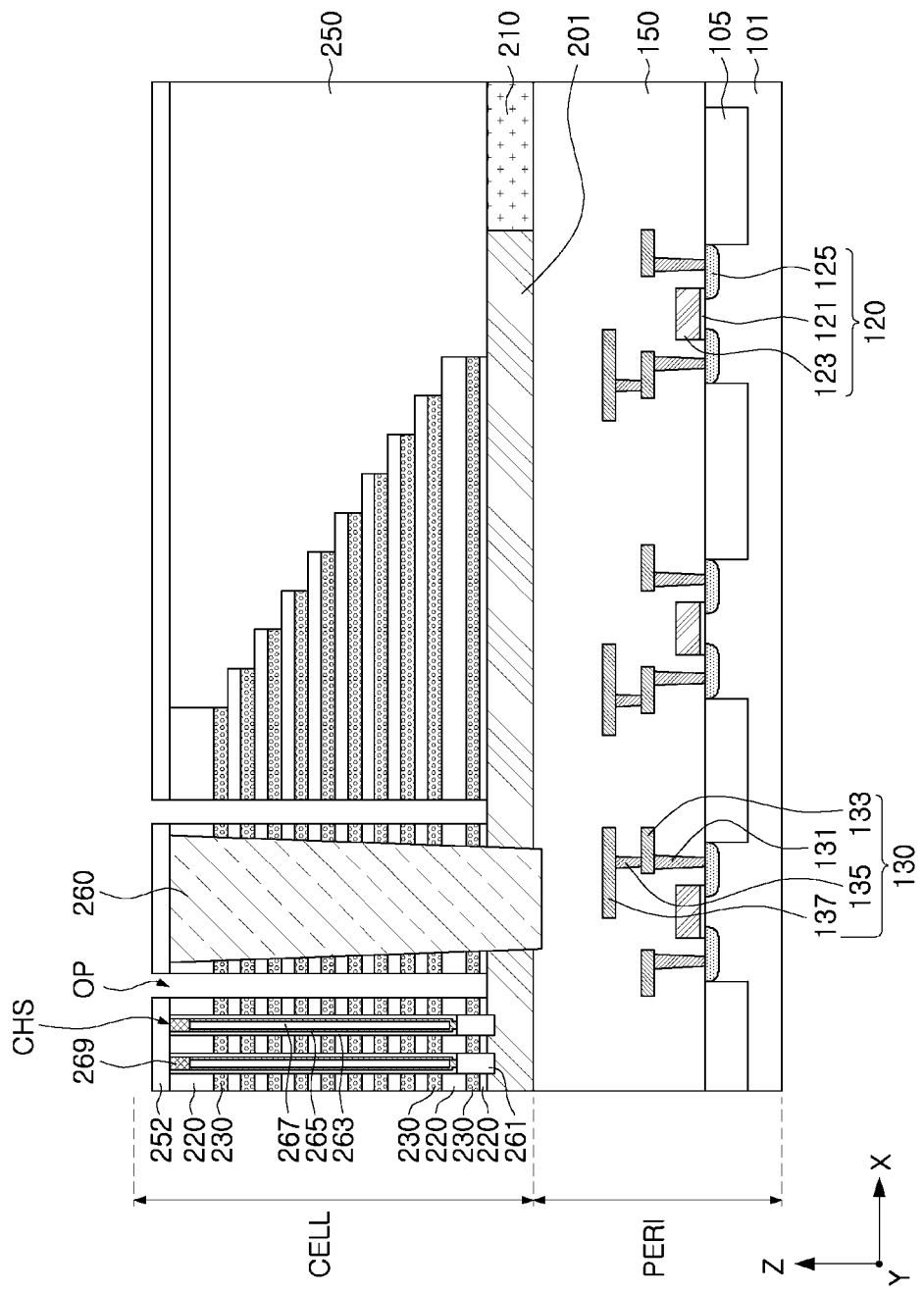

Referring to FIG. 24, an opening OP is provided, and sacrificial layers 240 may be removed using the opening. Moreover, a conductive material is embedded in a region from which the sacrificial layers 240 are removed to form the gate electrodes 230.

The gate electrodes 230 may include metal, polycrystalline silicon, and/or a metal silicide material. In example embodiments, before the gate electrodes 230 are provided, a portion of the gate dielectric layer 263 may be provided first.

Before the opening OP is provided, a second upper interlayer insulating layer 252, covering the mold insulating layer 220, the channel structures CHS, the through region 260, and the first upper interlayer insulating layer 250, may be provided.

The sacrificial layers 240, exposed through the opening OP, may be selectively removed using, for example, wet etching.

Figure 25:
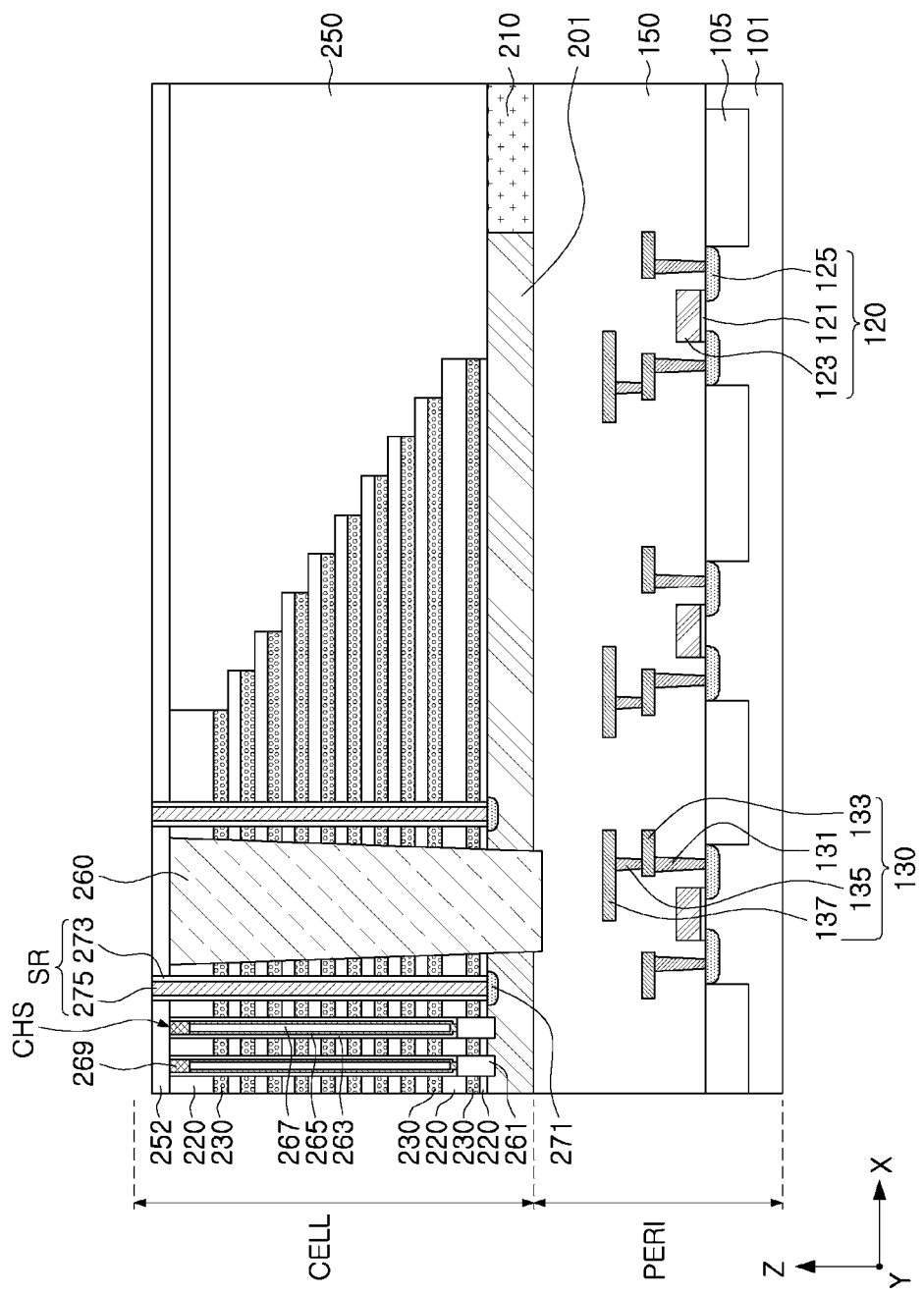

Referring to FIG. 25, an impurity is injected into the upper substrate 201, exposed by the opening OP, to form an impurity region 271. Then, an insulating layer 273 and a conductive layer 275 are formed in the opening OP. The insulating layer 273 and the conductive layer 275 may be a separation region SR. The conductive layer 275 may be a common source line. The conductive layer 275 may include, for example, tungsten, copper, and/or aluminum.

Figure 26:
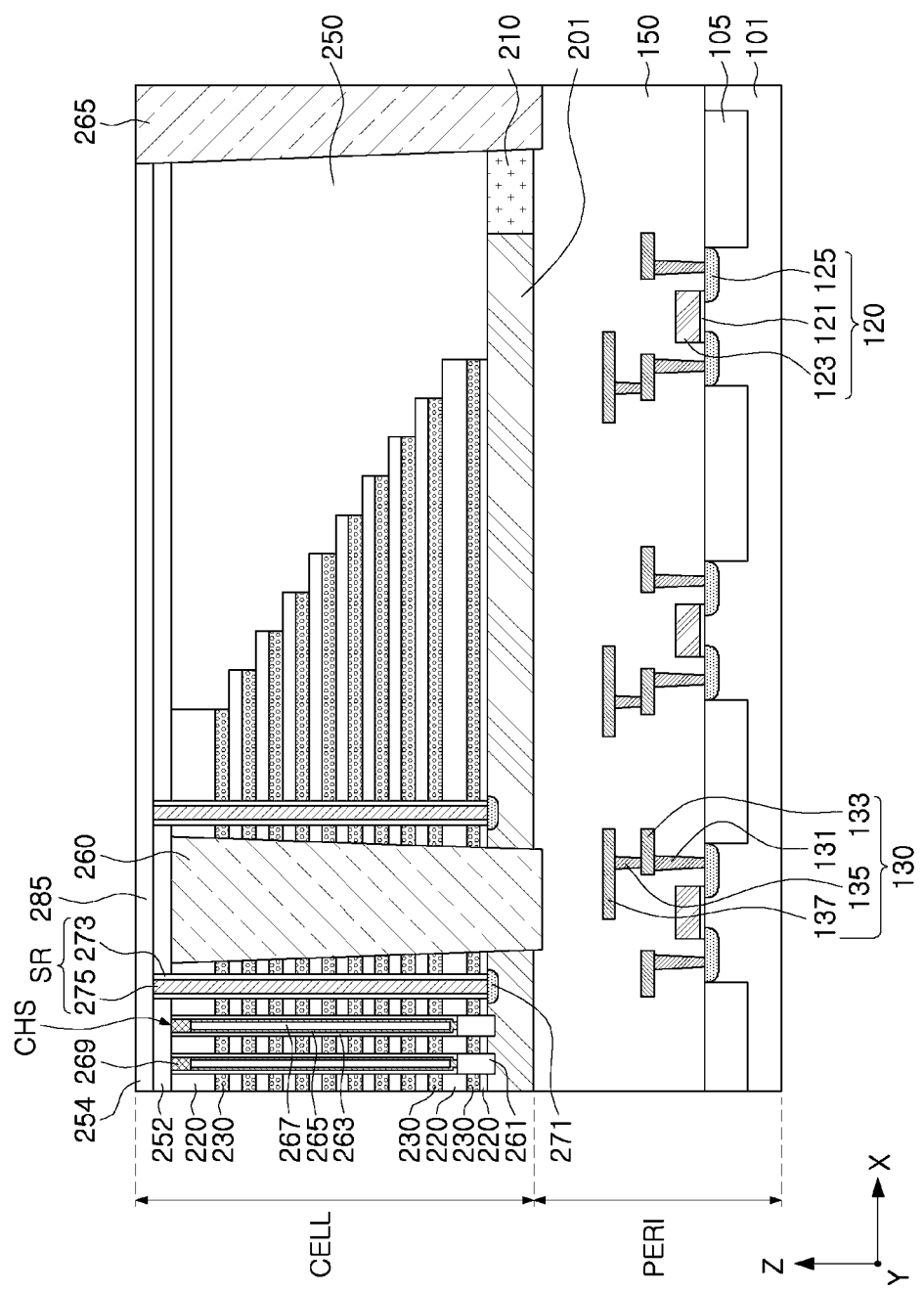

Referring to FIG. 26, a cutting region 265, passing through the first upper interlayer insulating layer 250, the second upper interlayer insulating layer 252, and the third upper interlayer insulating layer 254, as well as the semiconductor pattern 210, may be provided.

A third upper interlayer insulating layer 254, covering the second upper interlayer insulating layer 252, may be provided. Then, an opening passing through the first upper interlayer insulating layer 250, the second upper interlayer insulating layer 252, and the third upper interlayer insulating layer 254, as well as the semiconductor pattern 210, to expose the lower interlayer insulating layer 150 is provided using an anisotropic dry etching process, and the opening is filled with an insulating material to form a cutting region 265. An upper surface of the cutting region 265 may be coplanar with an upper surface of a second upper interlayer insulating layer 252. An upper surface of the cutting region 265 may be located higher than an upper surface of the through region 260 relative to the lower substrate 101. An upper surface of the cutting region 265 may be located higher than an upper surface of the channel structure CHS relative to the lower substrate 101. In other words, an upper surface of the cutting region 265 may be located higher than an upper surface of the channel pad 269 relative to the lower substrate 101.

The insulating material may be provided using a CVD or physical vapor deposition (PVD) process.

The cutting regions 265, between so as to cut or separate the semiconductor patterns 210 connecting the upper substrates 201 to each other, and connecting the upper substrate 201 to the lower substrate 101, is provided, thereby allowing the upper substrates 201 to be in a floating state.

Referring again to FIGS. 2 and 3, gate contact plugs 281 passing through the first upper interlayer insulating layer 250 and connected to the gate electrodes 230, and a first through plug 285 passing through the through region 260 and connected to the lower wiring structure 130, may be provided. Together with the first through plug 285, a second through plug 287 may be provided between the cutting regions 265.

As set forth above, according to example embodiments of the present inventive concept, after a process of etching channel holes, a cutting region cutting a bridge pattern connecting upper substrates is formed, thereby providing a semiconductor device with improved reliability and a method for manufacturing the same.

While example embodiments have been shown and described above, it will be apparent to those skilled in the art that modifications and variations could be made without departing from the scope of the present disclosure, as defined by the appended claims.

What is claimed is:

1. A semiconductor device, comprising:
   a peripheral circuit region including a lower substrate and circuit elements on the lower substrate;
   a first upper substrate and a second upper substrate on the peripheral circuit region;
   a first memory cell region on the first upper substrate and a second memory cell region on the second upper substrate; and
   at least one cutting region between the first upper substrate and the second upper substrate, the at least one cutting region formed of an insulating material;
   wherein each of the first and second memory cell region comprises:
      a plurality of gate electrodes stacked in a vertical direction perpendicular to an upper surface of the lower substrate and spaced apart from each other;
      a plurality of separation regions penetrating through the plurality of gate electrodes in the vertical direction and extending in a first direction parallel to an upper surface of the lower substrate; and
      a plurality of channel structures penetrating through the plurality of gate electrodes and extending in the vertical direction, each of the plurality of channel structures including a channel layer,
   wherein the at least one cutting region is disposed between first step-shaped end portions of the plurality of gate electrodes of the first memory cell region and second step-shaped end portions of the plurality of gate electrodes of the second memory cell region,
   wherein a height of the at least one cutting region in the vertical direction is greater than at least one of a height of one of the plurality of channel structures in the vertical direction and a height of one of the plurality of separation regions in the vertical direction, and
   wherein a bottom of the at least one cutting region is located lower than a bottom of each of the first upper substrate and the second upper substrate.

2. The semiconductor device as claimed in claim 1, wherein a top of the at least one cutting region is located higher than a top of the one of the plurality of channel structures relative to the upper surface of the lower substrate.

3. The semiconductor device as claimed in claim 1, wherein a top of the at least one cutting region is located higher than a top of the one of the plurality of separation regions relative to the upper surface of the lower substrate.

4. The semiconductor device as claimed in claim 1, wherein each of the plurality of channel structures further includes a core insulating layer which side surfaces are surrounded by the channel layer and a gate dielectric layer between the channel layer and the plurality of gate electrodes.

5. The semiconductor device as claimed in claim 4, wherein each of the plurality of channel structures further includes a channel pad disposed on the core insulating layer and in contact with the channel layer, and
   wherein a top of the at least one cutting region is located higher than a top of the channel pad relative to the upper surface of the lower substrate.

6. The semiconductor device as claimed in claim 1, further comprising at least one semiconductor pattern between the first upper substrate and the second upper substrate and in contact with the at least one cutting region.

7. The semiconductor device as claimed in claim 6, wherein the at least one semiconductor pattern is between the at least one cutting region and the first upper substrate and protrudes from the first upper substrate in a horizontal direction in a plan view of the semiconductor device.

8. The semiconductor device as claimed in claim 7, wherein the at least one cutting region includes a protruding portion in contact with the at least one semiconductor pattern, the protruding portion having a convex curved surface.

9. The semiconductor device as claimed in claim 6, wherein the at least one semiconductor pattern is spaced apart from the first upper substrate and the second upper substrate, and
wherein the at least one cutting region includes a first cutting region between the first upper substrate and the at least one semiconductor pattern and a second cutting region between the second upper substrate and the at least one semiconductor pattern.

10. The semiconductor device as claimed in claim 9, wherein each of the first cutting region and the second cutting region includes a protruding portion in contact with the at least one semiconductor pattern, the protruding portion having a convex curved surface.

11. The semiconductor device as claimed in claim 1, wherein the first upper substrate and the second upper substrate are spaced apart from each other.

12. A semiconductor device, comprising:
a peripheral circuit region including a lower substrate and circuit elements on the lower substrate;
a first upper substrate and a second upper substrate on the peripheral circuit region;
a first memory cell region on the first upper substrate and a second memory cell region on the second upper substrate; and
at least one cutting region between the first upper substrate and the second upper substrate, the at least one cutting region formed of an insulating material;
wherein the first upper substrate includes a first protruding portion extending from the first upper substrate towards the second upper substrate, and the second upper substrate includes a second protruding portion extending from the second upper substrate towards the first upper substrate,
wherein the at least one cutting region is in contact with a first side surface of the first protruding portion and a second side surface of the second protruding portion,
wherein each of the first and second memory cell region comprises:
a plurality of gate electrodes stacked in a vertical direction perpendicular to an upper surface of the lower substrate and spaced apart from each other; and
a plurality of channel structures penetrating through the plurality of gate electrodes and extending in the vertical direction, each of the plurality of channel structures including a channel layer, and
wherein a height of the at least one cutting region in the vertical direction is greater than a height of one of the plurality of channel structures in the vertical direction.

13. The semiconductor device as claimed in claim 12, wherein a top of the at least one cutting region is located higher than a top of the one of the plurality of channel structures relative to the upper surface of the lower substrate, and
wherein a bottom of the at least one cutting region is located lower than a bottom of the one of the plurality of channel structures relative to the upper surface of the lower substrate.

14. The semiconductor device as claimed in claim 13, wherein the bottom of the at least one cutting region is located lower than a bottom of each of the first upper substrate and the second upper substrate.

15. The semiconductor device as claimed in claim 12, wherein the first side surface of the first protruding portion has a concave portion and the second side surface of the second protruding portion has a concave portion.

16. The semiconductor device as claimed in claim 15, wherein a side surface of the at least one cutting region includes a convex portion in contact with the first side surface of the first protruding portion and the second side surface of the second protruding portion.

17. A semiconductor device, comprising:
a lower substrate;
circuit elements on the lower substrate;
a lower interlayer insulating layer at least partially covering the circuit elements on the lower substrate;
a plurality of upper substrates on the lower substrate;
a plurality of stack structures on the plurality of upper substrates, respectively, each of the plurality of stack structures including mold insulating layers and gate electrodes alternately stacked;
a plurality of channel structures penetrating through the plurality of stack structures and extending in a vertical direction perpendicular to an upper surface of the lower substrate;
an upper interlayer insulating layer at least partially covering the plurality of stack structures; and
at least one cutting region between the plurality of upper substrates, the at least one cutting region formed of an insulating material,
wherein the at least one cutting region penetrating through the upper interlayer insulating layer and spaced apart from the plurality of stack structures in a horizontal direction in a plan view of the semiconductor device, and
wherein a height of the at least one cutting region in the vertical direction is greater than a height of one of the plurality of channel structures in the vertical direction.

18. The semiconductor device of claim 17, further comprising a plurality of semiconductor patterns between the at least one cutting region and the plurality of upper substrates, and protruding from the plurality of upper substrates in a horizontal direction in a plan view of the semiconductor device.

19. The semiconductor device as claimed in claim 18, wherein the at least one cutting region comprises a plurality of cutting regions spaced apart from each other, and
wherein the plurality of cutting regions are in contact with the plurality of semiconductor patterns, respectively.

20. The semiconductor device as claimed in claim 17, further comprising a plurality of semiconductor patterns between the plurality of upper substrates,
wherein the at least one cutting region comprises a plurality of cutting regions between the plurality of semiconductor patterns and the plurality of upper substrates, and
wherein the plurality of cutting regions are extended along a side surface of the plurality of upper substrates in contact with one of the plurality of upper substrates and in contact with the plurality of semiconductor patterns.

* * * * *